(12) United States Patent
Varel et al.

(10) Patent No.: US 12,050,239 B2
(45) Date of Patent: Jul. 30, 2024

(54) RF METAMATERIAL ANTENNA FREQUENCY MATCHING METHOD

(71) Applicant: Kymeta Corporation, Redmond, WA (US)

(72) Inventors: Cagdas Varel, Seattle, WA (US);
Steven H. Linn, Hillsboro, OR (US);
Seyed Mohamad Amin Momeni Hasan Abadi, Redmond, WA (US);
Hussein Esfahlani, Kirkland, WA (US);
Mohsen Sazegar, Kirkland, WA (US);
Ryan Stevenson, Woodinville, WA (US)

(73) Assignee: KYMETA CORPORATION, Redmond, WA (US)

( * ) Notice: Subject to any disclaimer, the term of this patent is extended or adjusted under 35 U.S.C. 154(b) by 118 days.

(21) Appl. No.: 17/736,795

(22) Filed: May 4, 2022

(65) Prior Publication Data
US 2023/0358795 A1 Nov. 9, 2023

Related U.S. Application Data

(60) Provisional application No. 63/184,704, filed on May 5, 2021.

(51) Int. Cl.
*H01Q 3/24* (2006.01)
*G01R 29/08* (2006.01)
(Continued)

(52) U.S. Cl.
CPC ......... *G01R 29/0814* (2013.01); *H04B 17/11* (2015.01); *H04B 17/21* (2015.01)

(58) Field of Classification Search
CPC .. H01Q 1/28; H01Q 3/00; H01Q 3/24; H01Q 5/314; H01Q 5/335; H01Q 5/48; H01Q 13/28; H01Q 15/00; H01Q 21/06
See application file for complete search history.

(56) References Cited

U.S. PATENT DOCUMENTS

| 2015/0229028 A1* | 8/2015 | Bily | H01Q 15/0006 |
|---|---|---|---|
| | | | 342/371 |
| 2017/0338569 A1 | 11/2017 | Hower et al. | |

(Continued)

OTHER PUBLICATIONS

International Search Report and Written Opinion on the Patentability of Application No. PCT/US2022/027912 Mailed Aug. 26, 2022, 11 pages.

(Continued)

*Primary Examiner* — Hoang V Nguyen
(74) *Attorney, Agent, or Firm* — Womble Bond Dickinson (US) LLP

(57) ABSTRACT

Processes and apparatuses for antenna frequency matching are disclosed. In one embodiment, a calibration process for an antenna having radio-frequency (RF) radiating antenna elements comprises: determining resonance frequencies of RF radiating antenna elements in a group of RF radiating antenna elements; selecting voltages to apply to the RF radiating antenna elements to cause resonance frequencies to match between the RF radiating antenna elements in the group of RF radiating antenna elements when the voltages are applied; and storing, in memory of the antenna, voltage information indicative of the voltages for driving the RF radiating antenna elements in the group.

22 Claims, 17 Drawing Sheets

(51) Int. Cl.
*H01Q 21/06* (2006.01)
*H04B 17/11* (2015.01)
*H04B 17/21* (2015.01)

(56) References Cited

U.S. PATENT DOCUMENTS

| | | |
|---|---|---|
| 2018/0076521 A1 | 3/2018 | Mehdipour et al. |
| 2018/0109272 A1 | 4/2018 | Talty et al. |
| 2021/0050671 A1* | 2/2021 | Stevenson .......... H01Q 21/0012 |

OTHER PUBLICATIONS

International Preliminary Report on Patentability received for PCT Patent Application No. PCT/US22/27912, mailed on Nov. 16, 2023, 7 pages.

* cited by examiner

Evaluate an aggregate resonance responses of the groups of RF radiating antenna elements (e.g., adjusting resonance frequency curves of the antenna elements based on the aggregate resonance responses, measuring the quality (Q) factor of the antenna, etc.)
301

Determine resonance frequency to use with the antenna elements of the antenna (e.g., adjusting voltage applied to the RF radiating antenna elements to cause the resonance frequencies of RF antenna elements in the groups of RF antenna elements to match each other, determining resonance frequency tuning curves to use with the antenna elements of the antenna, etc.)
302

FIG. 3

401 — Determine ON and OFF resonance frequencies for each group (e.g., antenna segment) of a plurality of groups of the RF radiating antenna elements (e.g., varactor-based antenna elements, LC-based antenna elements, surface scattering antenna elements, metamaterial antenna elements, etc.), using a tester (e.g., FST, LFST, etc.) to determine a first frequency range

402 — Determinine a minimum high frequency among the group's high frequencies and the maximum low frequency among the group's low frequencies (e.g., determine a minimum of the OFF resonance frequency among the groups, determine a maximum of the ON resonance frequency among the groups, etc.)

403 — Determine a new tuning range based on the difference between the minimum high frequency among the group's high frequencies and the maximum low frequency among the group's low frequencies (e.g., a difference between the ON and OFF frequencies that represents an overlapping frequency range where the frequency ranges between the ON and OFF resonance frequencies of all the groups of RF radiating antenna elements overlaps)

404 — Divide the new tuning range into a predetermined number (N) of points (e.g., equally separated points, etc.) representing target resonance frequency values

405 — Perform a test (e.g., FST, LFST, etc.) on each group (e.g., segment)

406 — Determine voltage values, for each group of antenna elements, for generating the target resonance frequencies for each of the predetermined (N) points of the new tuning range when the voltages are applied to each group of RF antenna elements (e.g., selecting a voltage value for each point for a group of antenna elements if multiple voltage values are available)

407 — Store in memory (e.g., an EEPROM, etc.) the determined voltage values of each group of antenna elements, or voltage indication thereof, for each point.

408 — Access the memory, when the groups of RF antenna elements are to operate, to obtain and use the voltages to drive the RF radiating antenna elements to generate one or more beams with the antenna

FIG. 4

RF METAMATERIAL ANTENNA FREQUENCY MATCHING METHOD

RELATED APPLICATION

The present application is a non-provisional application of and claims the benefit of U.S. Provisional Patent Application No. 63/184,704, filed May 5, 2021 and entitled "RF Metamaterial Antenna Frequency Matching Method", which is incorporated by reference in its entirety.

FIELD OF THE INVENTION

Embodiments disclosed herein are related are in the field of communications including satellite communications and antennas. More particularly, embodiments disclosed herein relate to configure flat panel antennas by setting resonance frequency of radio-frequency (RF) radiating antenna elements.

BACKGROUND

Satellite communications involve transmission of microwaves. Such microwaves can have small wavelengths and be transmitted at high frequencies in the gigahertz (GHz) range. Antennas can produce focused beams of high-frequency microwaves that allow for point-to-point communications having broad bandwidth and high transmission rates. A measurement that can be used to determine if an antenna is properly functioning is a microwave frequency response. The microwave frequency response is a quantitative measure of the output spectrum of the antenna in response to a stimulus or signal and can provide a measure of the magnitude and phase of the output of the antenna as a function of frequency in comparison to the input stimulus or signal. Determining the microwave frequency response for an antenna is a useful performance measure for the antenna.

Some antenna apertures are constructed using radio-frequency (RF) metamaterial antenna segments. These apertures have thousands of RF antenna elements that form an array. Each of the antenna elements is addressed individually to generate and radiate a desired RF wave. Testing such antenna elements to identify RF antenna elements operating incorrectly is difficult when the measured response is an average response of all the RF elements in a segment unless many elements (e.g., 2-4%, 100-200 elements, etc.) are deficient.

Historically, RF metamaterial antenna segments have been fabricated based on liquid crystal (LC) display backplane manufacturing methods. These manufacturing methods are tightly controlled, but they still have variations. These variations can occur due to variations in passivation layer thickness, metal trace resistance and transistor characteristics such as on current and turn on voltage. The tuning element in the RF metamaterial antenna can be LC, a varactor diode, RF micro-electromechanical system (MEMS), etc. Each tuning element material will have its own manufacturing variation and associated tolerance, in addition to the variation from backplane manufacturing process. Both variations will affect the RF antenna element resonant frequency. Currently, manufacturers can't control the process variations to the level which minimizes RF antenna element frequency variations, which results in an RF antenna element population with a large frequency variation that either decreases the gain of the RF antenna or diminishes the yield of the manufacturing process.

SUMMARY

Processes and apparatuses for antenna frequency matching are disclosed. In one embodiment, a calibration process for an antenna having radio-frequency (RF) radiating antenna elements comprises: determining resonance frequencies of RF radiating antenna elements in a group of RF radiating antenna elements; selecting voltages to apply to the RF radiating antenna elements to cause resonance frequencies to match between the RF radiating antenna elements in the group of RF radiating antenna elements when the voltages are applied; and storing, in memory of the antenna, voltage information indicative of the voltages for driving the RF radiating antenna elements in the group.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIG. 3 is a flow diagram of another embodiment of a general calibration process.

FIG. 4 is a flow diagram of one embodiment of a more specific calibration process for an antenna.

DETAILED DESCRIPTION

Figure 1:
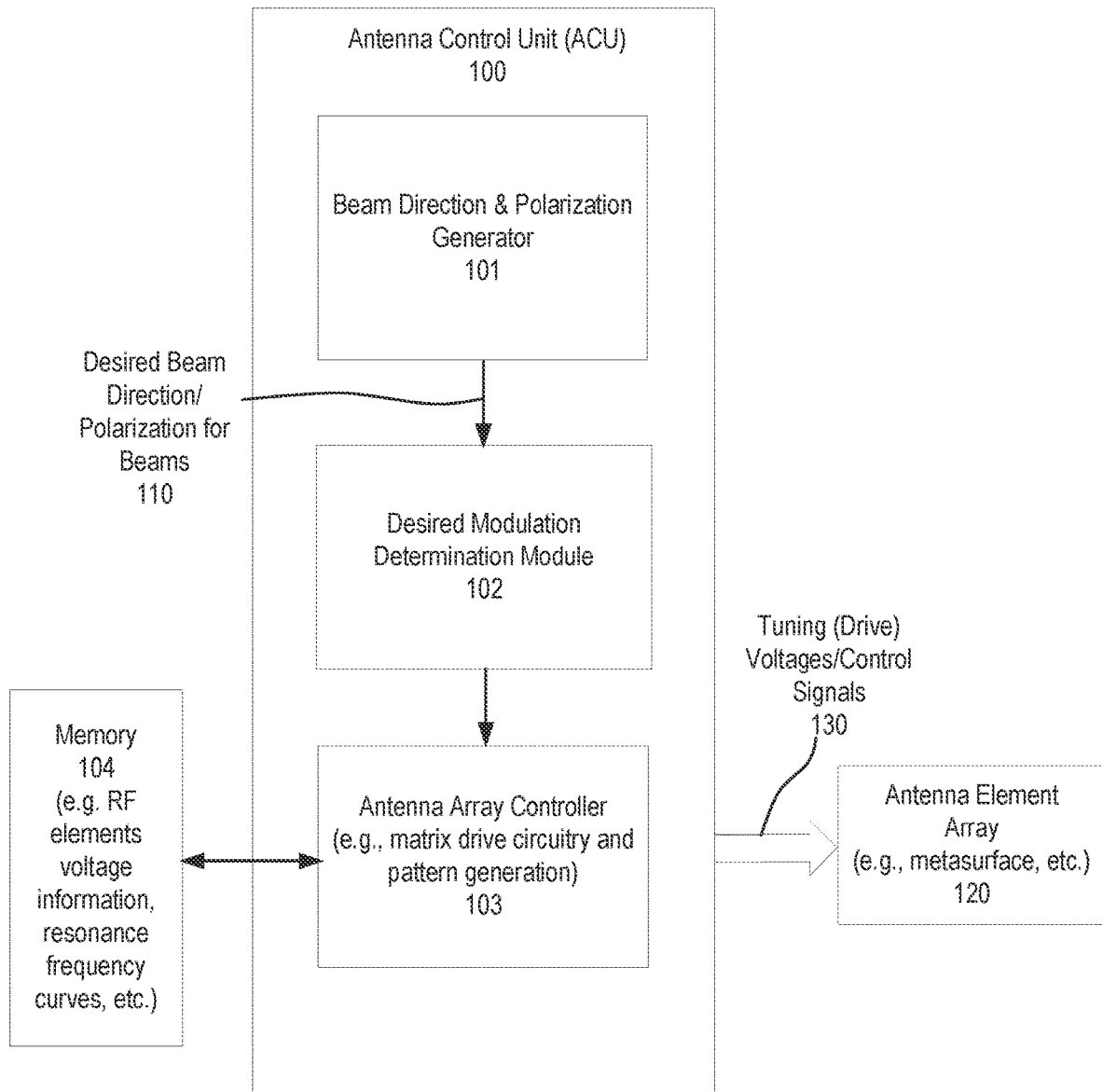
FIG. 1 illustrates some embodiments of an antenna control unit (ACU) of an antenna.

In the following description, numerous details are set forth to provide a more thorough explanation of the present disclosure. It will be apparent, however, to one skilled in the art, that the present disclosure may be practiced without these specific details. In other instances, well-known structures and devices are shown in block diagram form, rather than in detail, to avoid obscuring the present disclosure.

Embodiments described herein include techniques for correcting for resonance frequency differences between radio-frequency (RF) radiating antenna elements or a group of RF antenna elements. Examples of RF radiating antenna elements are described below. However, the techniques described herein are not limited to those RF radiating antenna elements.

More specifically, RF radiating antenna elements can be resonating at slightly different resonance frequencies when the same voltage is applied. This is most often due to the variations in manufacturing of the driving circuit or the RF antenna element. The variation in resonance frequency from RF antenna element to RF antenna element will degrade the antenna performance. In some embodiments, a procedure is used to match the resonating frequency of each RF antenna element or a group of RF antenna elements by adjusting the voltage applied to it. These adjustments are made to the antenna panel as part of an antenna panel configuration process.

In some embodiments, the antenna panel configuration process is performed using a testing process with free space tester (FST), such as described below, or described in U.S. Pat. No. 10,312,600, entitled "FREE SPACE SEGMENT TESTER (FSST)", issued on Jun. 4, 2019, and U.S. Pat. No. 10,620,250, entitled "LOCALIZED FREE SPACE TESTER", issued on Apr. 14, 2020. These are referred to herein as FST and LFST, respectively.

In some embodiments, the testing process examines a group of resonators (e.g., a one-inch sized diameter circle of antenna elements/resonators, an entire segment of antenna elements, sets of resonators of other shapes and sizes, etc.). In some embodiments, the aggregate resonance response is evaluated to determine improved and/or optimal resonance tuning curves to use with the antenna elements of the aperture. In some embodiments, the quality (Q) factor of the aggregate response of the entire aperture is measured and improved, and potentially optimized, by adjusting the resonance frequency curves of each of the associated antenna elements. In some embodiments, the process ends with a set of stored resonance tuning curves for the aperture. Thereafter, when the antenna is in use, these resonance tuning curves are used, when a control pattern is generated for the antenna, to produce voltages for the RF radiating antenna elements based on the calibrated resonance frequency that is trying to be achieved.

In some embodiments, the RF antenna elements are varactor-based antenna elements of a varactor antenna of a metasurface antenna in which a varactor is used as a tuning element for the antenna element. However, the techniques disclosed herein are also applicable to liquid crystal (LC)-based antenna elements of a metasurface antenna such as described below. Fast switching and large tuning characteristics of varactors enable resonance frequency matching between RF elements. Use of the techniques disclosed herein, including performing resonance frequency matching between RF elements and/or group of RF elements, would result in a uniform resonant frequency over the whole antenna surface.

In some embodiments, the antenna being calibrated can be at a number of different levels of integration. In some embodiments, the calibration process is applied to the antenna aperture at the raw glass level (where one or more glass substrates are used to form the antenna elements) or portions thereof (e.g., segments, part of segments, etc.). In some other embodiments, the calibration process is applied after adding a wide area impedance matching (WAIM) layer to the aperture. In yet some other embodiments, the calibration process is applied after a radome or other protection layer is applied or coupled to the top of the aperture. In essence, the calibration process can be applied to the aperture after a manufacturing operation that can cause shifts in resonance frequency.

The techniques disclosed herein can be used to compensate for the frequency variation among RF radiating antenna elements by customizing the applied voltage level for each RF element, group of RF elements or the RF antenna segment. More specifically, using the techniques herein, a set of target resonance frequencies that are covered by the frequency tuning ranges of all the elements, or all the groups of elements or RF radiating antenna segments can be determined and then, based on that determination, the voltage levels required by each RF element, each group of elements or RF radiating antenna segments, to reach the on, off or grey level resonance frequencies in that tuning range can be determined. These voltage levels are stored and then accessed and used to drive the RF radiating antenna elements when the antenna is in use, for example, generating beams (such as described in further detail below).

FIG. 1 illustrates some embodiments of an antenna control unit (ACU) that accesses the voltages generated as part of calibration process and uses those voltages to drive RF radiating antenna elements when generating the modulation for an array of RF radiating antenna elements. In some embodiments, the ACU comprises hardware (e.g., circuitry, dedicated logic, etc.), software (e.g., software running on a chip(s) or processor(s), etc.), firmware, or a combination of the three.

Referring to FIG. 1, a beam direction and polarization generator 101 of ACU 100 generates beam directions and polarizations (110) for the one or more beams and provides these to beam modulation determination module 102. In response, beam modulation determination module 102 generates the modulation for the antenna elements.

An antenna array controller (e.g., matrix drive pattern generator) 103 of ACU 100 generates tuning (drive) voltages and control signals (130) that are sent to antenna elements in array 120 (e.g., antenna elements 120 of a metasurface). In some embodiments, controller 103 generates tuning (drive) voltages and control signals (130) based on the voltage information stored in memory 104. This information can be voltage values for individual RF radiating antenna elements or voltage information from which such voltage values may be generated. For example, the voltage information can be resonance frequency curves. In some embodiments, the voltage information stored in memory is generated by a configuration process, such as described herein. Based on the tuning voltages and control signals (130), the antenna elements generate one or more beams in a manner well-known in the art.

Example Calibration Processes

There are a number of calibration processes for generating the voltage values for driving individual RF radiating antenna elements or voltage information from which such voltage values may be generated (e.g., resonance frequency curves). In some embodiments, these processes are run to create voltages that are applied to, or drive, RF radiating antenna elements so that the resonance frequency of all the antenna elements in a group of antenna elements (e.g., a segment of antenna elements, a group of segments of antenna elements, an aperture of antenna elements, etc.) match with each other.

Figure 2A:
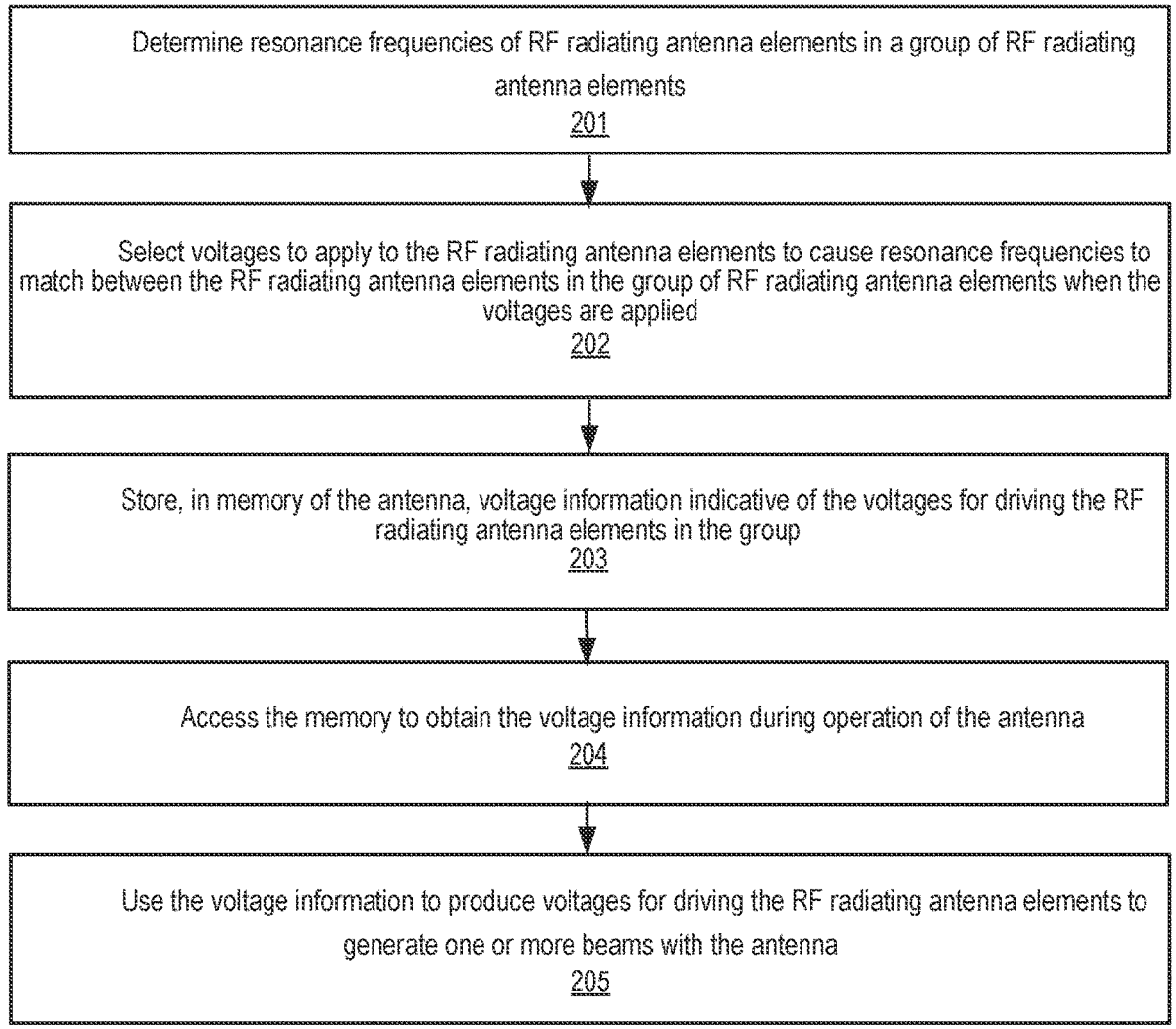
FIG. 2A is a flow diagram of some embodiments of a calibration process.

FIG. 2A is a flow diagram of some embodiments of a calibration process. In some embodiments, the process is performed by processing logic comprising hardware (e.g., circuitry, dedicated logic, etc.), software (e.g., software running on a chip, software run on a general-purpose computer system or a dedicated machine, etc.), firmware, or a combination of the three.

Referring to FIG. 2A, the process begins by processing logic determining resonance frequencies of RF radiating antenna elements in a group of RF radiating antenna elements (processing block 201). After determining resonance frequencies, processing logic selects voltages to apply to the RF radiating antenna elements to cause resonance frequencies to match between the RF radiating antenna elements in the group of RF radiating antenna elements when the voltages are applied (processing block 202). Processing logic stores, in memory of the antenna, voltage information indicative of the voltages for driving the RF radiating antenna elements in the group (processing block 203).

Subsequently, processing logic accesses the memory to obtain the voltage information during operation of the antenna (processing block 204) and uses the voltage information to produce voltages for driving the RF radiating antenna elements to generate one or more beams with the antenna (processing block 205).

Figure 2B:
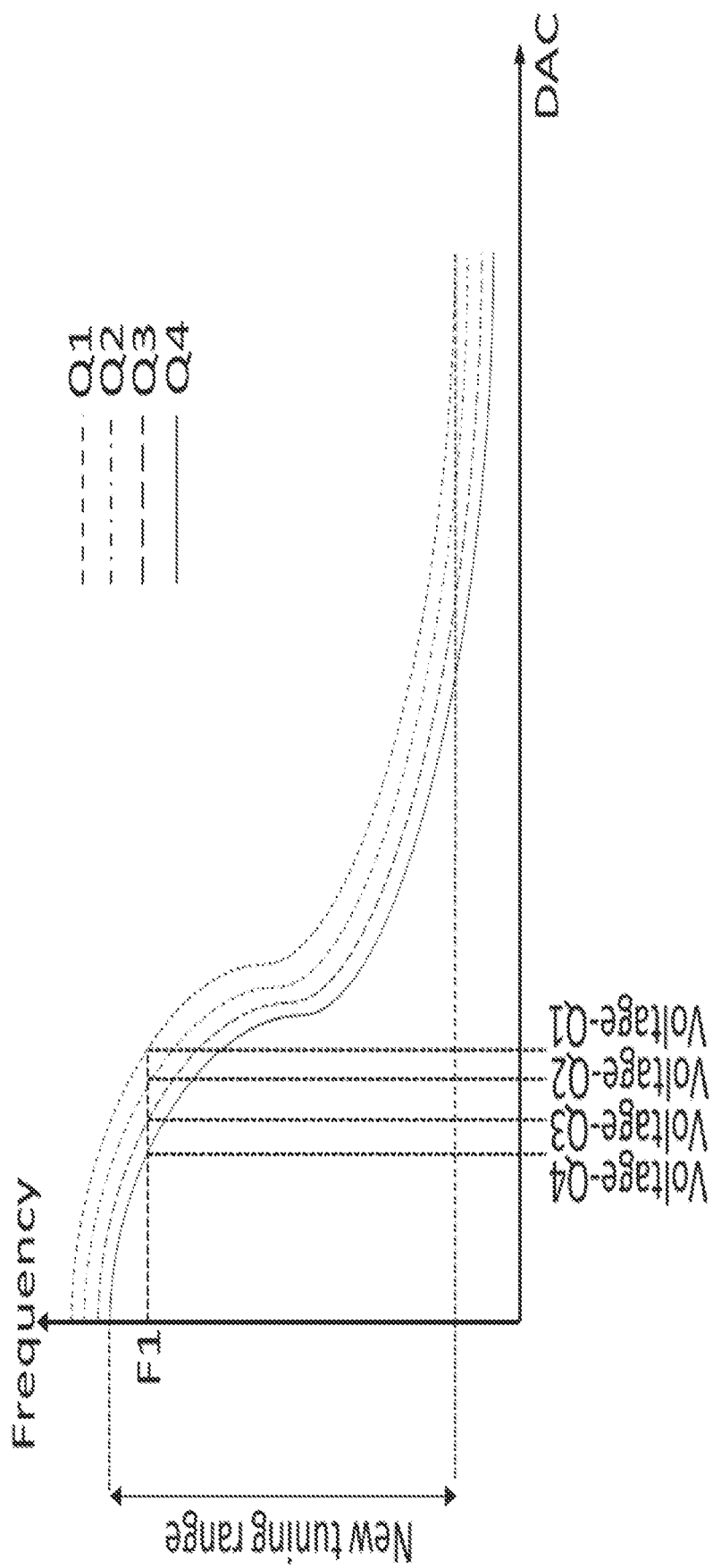
FIG. 2B illustrates an example of a resonance frequency curve that is generated after resonance frequency matching segments.

In some embodiments, the voltage may be in the form of a resonance frequency curve. FIG. 2B illustrates an example of a resonance frequency curve. The resonance frequency curves can be a new tuning range that is generated after resonance frequency matching segments in which the resonance frequency of RF radiating antenna elements of multiple antenna segments (groups) of RF radiating antenna elements are matched with each other. Referring to FIG. 2B, a new tuning range is created after resonance frequency matching antenna segments Q1-Q4. As an example, new voltage values for a frequency F1 for each segment is shown as Voltage-Q1, Voltage-Q2, Voltage-Q3 and Voltage-Q4.

Operations for Resonance Frequency Matching in FST or RFST

In some embodiments, as stated above, a goal of the resonance frequency matching process is to align the resonance frequency of each of the antenna elements when voltages are applied. In some embodiments, the process is applied to groups of RF radiating antenna elements. In some embodiments, the groups of RF radiating antenna elements are one or more aperture segments of RF radiating antenna elements. In some embodiments, in such cases, the resonance frequency matching is performed based on the aggregate resonance responses of the groups of RF radiating antenna elements.

FIG. 3 is a flow diagram of another embodiment of a general calibration process. In some embodiments, the process is performed by processing logic comprising hardware (e.g., circuitry, dedicated logic, etc.), software (e.g., software running on a chip, software run on a general-purpose computer system or a dedicated machine, etc.), firmware, or a combination of the three.

Referring to FIG. 3, the process begins by processing logic evaluating an aggregate resonance responses of the groups of RF radiating antenna elements (processing block 301). In some embodiments, processing logic evaluates an aggregate resonance responses of the groups of RF radiating antenna elements by adjusting resonance frequency curves of the antenna elements based on the aggregate resonance responses. In some other embodiments, processing logic evaluates an aggregate resonance responses of the groups of RF radiating antenna elements by measuring the quality (Q) factor of the antenna.

Based on the evaluation, processing logic determines the resonance frequency to use with the antenna elements of the antenna (processing block 302). In some embodiments, processing logic determines the resonance frequency to use with the antenna elements of the antenna by, at least in part, adjusting voltage applied to the RF radiating antenna elements to cause the resonance frequencies of RF antenna elements in the groups of RF antenna elements to match each other. In some embodiments, processing logic determines the resonance frequency to use with the antenna elements of the antenna by, at least in part, determining resonance frequency tuning curves to use with the antenna elements of the antenna.

A step-by-step description of some embodiments of a calibration is provided below. This calibration can be applied in the free space test (FST) or localized free space tester (LFST) described below and available at Kymeta Corporation of Redmond, Washington, to match resonance frequencies between RF antenna segments. Note tests other tests may be used. Additionally, the same methodology can be used to improve the quality factor (Q) of the RF antenna element. If there are multiple voltage values tuning the RF element to the target frequency, an algorithm compares the Q at each voltage value and selects the one that gives the highest Q for the element. In this way, the Q is used as the performance measure.

In some embodiments, the test setup for the frequency matching method will be the same as an FST or LFST setup with additional software. This additional software controls the driving circuit to perform the test. In some embodiments the software can choose to drive only the elements under test to reduce the test time. In some embodiments, this is accomplished by enabling the gate lines in the active matrix for the elements under test and rapidly cycling through all the voltage steps provided by the driver IC or a drive circuitry specific to this test.

FIG. 4 is a flow diagram of one embodiment of a more specific calibration process for an antenna. In some embodiments, the process is performed by processing logic comprising hardware (e.g., circuitry, dedicated logic, etc.), software (e.g., software running on a chip, software run on a general-purpose computer system or a dedicated machine, etc.), firmware, or a combination of the three.

The following describes the calibration process of FIG. 4 using an FST and then describes the calibration process of FIG. 4 using LFST. Note that the process of FIG. 4 can be used with other tests.

Referring to FIG. 4, in some embodiments, the process begins at processing block 401 where an FST is used on all antenna segments of the antenna aperture to determine their "OFF" and "ON" frequencies. That is, the ON and OFF resonance frequencies for each group (e.g., antenna segment) of a plurality of groups of the RF radiating antenna elements (e.g., varactor-based antenna elements, LC-based antenna elements, surface scattering antenna elements, metamaterial antenna elements, etc.), are determined using a tester (e.g., FST, LFST, etc.) to determine a first frequency range. In some embodiments, the antenna segments when brought together form an antenna aperture (e.g., an antenna aperture with RF radiating antenna elements (e.g., surface scattering metamaterial antenna elements, etc.). In some embodiments, four antenna segments are brought together to form an antenna aperture. Other numbers of segments may be used to form antenna apertures (e.g., 2 segments, 3 segments, 5 segments, etc.). For more information on segmented antenna arrays, see below and see U.S. Pat. No. 9,887,455, titled "Aperture Segmentation of a Cylindrical Feed Antenna", issued on Feb. 6, 2018.

As part of the FST process, the minimum and maximum voltages that can be supplied by the driver are known and those values are applied to each antenna segment to see what their frequency limits are. In some embodiments, the result of this is, for each of the antenna segments, a frequency range is identified by the highest and lowest resonant frequencies for which the segment operates.

After performing the matching, processing logic determines a minimum high frequency among the group's high frequencies and the maximum low frequency among the group's low frequencies (e.g., determine a minimum of the OFF resonance frequency among the groups, determine a maximum of the ON resonance frequency among the groups, etc.) (processing block 402). In some embodiments, for LC-based metamaterial antenna elements, this is performed by determining new OFF and ON resonance frequencies after the matching:

OFF frequency: minimum of OFF resonance frequencies among 4 segments
ON frequency: maximum of ON resonance frequencies among 4 segments In other words, in some embodiments, the calibration process identifies the minimum of the four segments' high frequencies and the maximum from the four segments' low frequencies.

In some other embodiments, for varactor-based metamaterial antenna elements, this is performed by determining new OFF and ON resonance frequencies after the matching:

OFF frequency: maximum of OFF resonance frequencies among 4 segments
ON frequency: minimum of ON resonance frequencies among 4 segments.

Next, processing logic determines a new tuning range based on the difference between the new OFF and ON resonance frequencies (processing logic 403). That is, the tuning range is the difference between the minimum high frequency among the group's high frequencies and the maximum low frequency among the group's low frequencies. In some embodiments, this tuning range is one in which all four segments can operate, and thus, this tuning range is the frequency range representing the frequency ranges in which all four segments overlap. In some embodiments, this overlapping area of all four segments is determined by subtracting the identified minimum frequency of the four segments' high frequencies from the maximum of the four segments' low frequencies.

Once the new tuning range has been identified, processing logic divides the new tuning range into a predetermined number, N, of points (e.g., equally separated points, non-equally separate points, etc.) (processing block 404). These can be created by separating the new tuning range into parts. These new frequencies will be the target resonance frequency values for the RF antenna. The predetermined number N can change based on the desired resolution in frequency. For example, if the tuning range is from 13 GHz to 14 GHz and N equals ten, then in some embodiments, the different points may be 13 GHz, 13.1 GHz, 13.2 GHz, . . . , 14 GHZ. These points will be the target resonance frequencies corresponding to different gray levels for use in processing block 405.

With the frequencies for the predetermined N points, processing logic performs an FST on each segment (e.g., each group of RF radiating antenna elements) using the highest voltage resolution possible in the driver circuitry for driving the antenna elements (processing block 405).

In some embodiment, if a general thin film transistor (TFT) source driver is used to drive the segment, the processing logic uses all the available voltage steps, for example 256, 512 or 1024 voltage steps. In some other embodiments, voltage resolutions other than the highest voltage resolution may be used.

During this FST test on each segment, the voltage for generating each of the frequencies at the points identified in processing block 404 is determined. In other words, by applying different voltages, processing logic makes a determination for each of the points for each of the segments as to which voltages cause the segment to generate each of the resonance frequencies of each of the points. Note that multiple different voltages when applied to the antenna elements of a particular segment may be able to produce the target resonance frequency associated with one of the points. Therefore, the results of performing the FST could be the identification of multiple voltages that can identify the target resonance frequency associated with each point for each segment. This can occur when the tuning curve is not changing to fast. In other words, for each segment, the FST determines which voltage(s) are needed to be applied to get the target resonance frequencies associated with the points.

Once voltages have been identified, processing logic chooses the new voltage values, for each segment, that are generating the target resonance frequencies described in processing block 404 (e.g., the target resonance frequencies for each of the predetermined (N) points of the new tuning range) (processing block 406). If there are multiple voltage values tuning the RF element to the target resonance frequency, choose the voltage value from among the one or more voltages (e.g., a voltage range) identified for which the target resonance frequency may be obtained. In some embodiments, the choice is made based on which voltage provided with the highest Q factor. In some embodiments, using the Q factor provides an indication of which voltage allows the segment to perform more efficiently.

After selecting new voltage values, processing logic stores the new voltage values in a memory (e.g., EEPROM, etc.) of each segment (processing block 407). In some embodiments, each segment has its own voltage list with the voltage chosen in processing block 406 (e.g., based on the Q factor) for each of the target resonance frequencies and the voltage list is stored in the EEPROM. In some embodiments, at this point, the antenna aperture is calibrated and the calibration process ends.

Thereafter, during verification or operation, when the segment(s) are to operate with one of the target resonance frequencies to, for example, generate one or more beams, processing logic accesses the voltage value for that resonance frequency from the memory and uses it while driving the RF radiating antenna elements of the segment to generate one or more beams with the antenna (processing block 408). In some embodiments, this occurs are part of a verification process.

An Example Process for Frequency Matching in LFST

The calibration process of FIG. 4 may be employed with a LFST instead of an FST. The operation of the calibration process using the LFST are described below. Note that in some embodiments, the operations described below can be applied in different ways. For example, in some embodiments, the operations are applied to all the antenna elements in an RF metamaterial antenna one by one. In some other embodiments, the operations are applied to all groups of antenna elements in an RF metamaterial antenna group by group. In some other embodiments, the operations are applied to all the antenna elements in a ring of RF metamaterial antenna elements one by one to match resonance frequencies within a ring of antenna elements.

First, processing logic performs a LFST on all the test points, or all the RF antenna elements, on a segment to determine "OFF" and "ON" resonance frequencies (processing block 401). In some embodiment, as part of the LFST process, the minimum voltage and the maximum voltage that can be supplied by the driver of an antenna element are known and those values are applied to each segment (or portion thereof as specified above (e.g., groups (e.g., 1" circles) of antenna elements that cover the array on the segment) to see what their frequency limits are. In some embodiments, the result of this operation, for each of the segments (or portion thereof as specified above), is the identification of a frequency range represented by the highest and lowest resonant frequency for which the segment operates.

Next, processing logic determines the new OFF and ON resonance frequencies after the resonance frequency matching (processing block 402):
  OFF resonance frequency: minimum of OFF resonance frequencies among four segments (or other numbers of segments);
  ON resonance frequency: maximum of ON resonance frequencies among four segments (or other numbers of segments).

In other words, the calibration process identifies the minimum of the four segment's high frequencies and the maximum from the four segment's low frequencies.

In some other embodiments, for varactor-based metamaterial antenna elements, this is performed by determining new OFF and ON resonance frequencies after the matching:
  OFF frequency: maximum of OFF resonance frequencies among 4 segments
  ON frequency: minimum of ON resonance frequencies among 4 segments.

Then, processing logic determine the new tuning range as the difference between new OFF and ON resonance frequency (processing block 403). In some embodiments, this tuning range is one in which all four segments can operate, and thus, this tuning range is where the turning ranges of all four segments overlap. In some embodiments, this tuning range is determined by subtracting the identified minimum frequency of the four segments' high frequencies from the maximum of the four segments' low frequencies.

Once identified, processing logic divides the new tuning range into a predetermined number, N, parts (e.g., equally separated parts, non-equally separated parts) (processing block 404). These new frequencies will be the target resonance frequency values for the RF antenna. In some embodiments, the predetermined number N can change based on the desired resolution in frequency. These new frequencies with be the target resonance frequency values for the RF antenna. N can change based on the desired resolution in frequency. For example, if the tuning range is from 13 GHz to 14 GHz and N equals ten, then in some embodiments, the different points may be 13 GHz, 13.1 GHz, 13.2 GHz, . . . , 14 GHZ. These points will be the target resonance frequencies corresponding to different gray levels for use in processing block 405.

At processing block 405, processing logic performs an LFST on each segment using the highest voltage resolution possible in the driver circuitry that is used to drive the antenna elements. In some embodiments, if a general TFT source driver is used to drive antenna elements of the segment, processing logic use all the available voltage steps, for example 256, 512 or 1024 voltage steps). Alternatively, voltage resolutions other than the highest voltage resolution may be used. During this LFST test on each segment, processing logic determines the voltage for generating each of the frequencies at the points identified in processing block 404. In other words, by applying different voltages, processing logic determines, for each of the points for each of the segments, which voltages cause the segment to generate each of the resonance frequencies of each of the points. Note that multiple different voltages when applied to the antenna elements of a particular segment (or parts thereof) may be able to produce the target resonance frequency associated with one of the points. Therefore, the results of performing the LFST could be the identification of multiple voltages that can identify the target resonance frequency associated with each point for each segment (or the parts thereof). This can occur when the tuning curve is not changing to fast. In other words, for each segment, the FST determines which voltage(s) are needed to be applied to the antenna elements to get each target resonance frequency associated with each of the points.

Thereafter, processing logic chooses the new voltage values, for each segment, that are generating the target frequencies described in processing block 404 (processing block 406). If there are multiple voltage values tuning the RF element to the target frequency, processing logic chooses the voltage value giving the highest Q factor. That is, processing logic chooses the voltage value from among the one or more voltages (e.g., a voltage range) identified for which the target resonance frequency may be obtained. In some embodiments, the choice is made based on which voltage provided with the highest Q factor. In some embodiments, using the Q factor provides an indication of which voltage allows the segment to perform more efficiently.

Once the new voltage values have been selected, processing logic stores the new voltage values in a memory (e.g., EEPROM) of each segment (processing block 407). In other words, each segment has its own voltage list with the voltage(s) chosen in processing block 406 (e.g., based on the Q factor) for each of the target resonance frequencies and the voltage list is stored in the memory. In some embodiments, at this point, the antenna aperture is calibrated and the calibration process ends.

Thereafter, during verification or operation, when the segment(s) are to operate with one of the target resonance frequencies, processing logic accesses the voltage value for that resonance frequency from stored memory and uses it while driving the segment (processing block 408).

Figure 5:
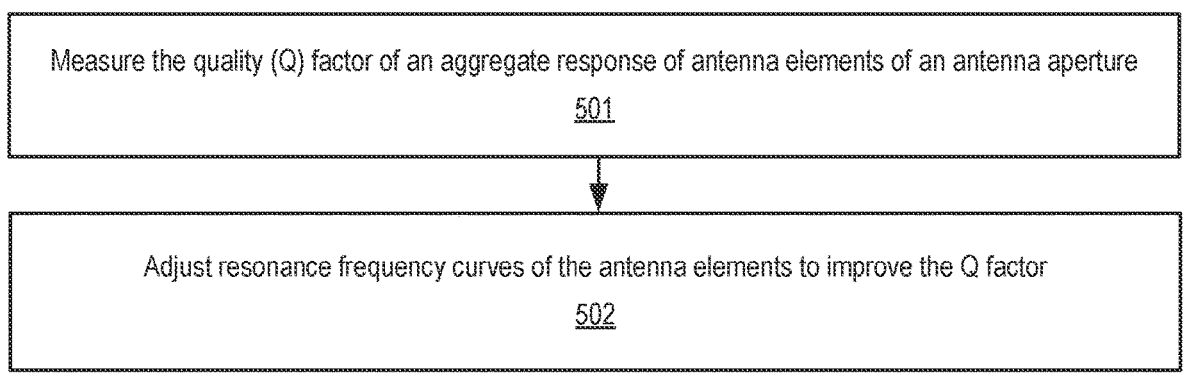
FIG. 5 is a flow diagram of another embodiment of the process for configuring an antenna comprising an aperture with a plurality of RF radiating antenna elements.

FIG. 5 is a flow diagram of another embodiment of the process for configuring an antenna comprising an aperture with a plurality of RF radiating antenna elements. In some embodiments, the process is performed by processing logic comprising hardware (e.g., circuitry, dedicated logic, etc.), software (e.g., software running on a chip, software run on a general-purpose computer system or a dedicated machine, etc.), firmware, or a combination of the three.

Referring to FIG. 5, the process begins by measuring the quality (Q) factor of an aggregate response of a group of RF radiating antenna elements of an antenna aperture (processing block 501). Based on the measure Q factor, processing logic adjusts one or more resonance frequency curves of one or more RF radiating antenna elements to improve the Q factor (processing block 502).

After adjusting the resonance frequency curves of the antenna elements, the resonance frequency curves are stored in memory (e.g., an EEPROM, etc.). In some embodiments, they are stored as voltage values for each of the RF radiating antenna elements or as information indicative of the voltage values of each of the antenna elements. Subsequently, when the groups of RF radiating antenna elements are to operate, the memory is accessed to obtain and use the voltages to drive the RF radiating antenna elements to generate one or more beams with the antenna.

Example of a Localized Free Space Tester

Methods and apparatuses are disclosed for a free space tester for testing radio-frequency (RF) radiating antenna elements, such as, for example, those discussed in more detail below. In one example, an apparatus includes a frame, a first antenna (e.g., a horn or other directional antenna), a filter, a second antenna (e.g., a horn or other directional antenna), a controller, and an analyzer. The frame has a platform to support an array of RF radiating antenna elements of a flat panel antenna. In some embodiments, the array of RF radiating antenna elements comprises all of the antenna elements of the antenna aperture. In another embodiment, the array of RF radiating antenna elements are those on one segment of antenna aperture formed by combining multiple (e.g., 2, 3, 4, etc.) segments of RF radiating antenna elements. In some embodiments, the segment comprises a thin film transistor (TFT) segment that contains antenna elements with TFTs used to control the antenna elements.

In some embodiments, of the tester, the first directional/horn antenna transmits microwave energy through a hole in the filter to a portion of the array of antenna elements under test (e.g., an aperture containing a plurality of antenna elements, a segment containing only a subset of antenna elements of an aperture, etc.) and receives reflected microwave energy from that portion of the array. The second directional/horn antenna receives microwave energy transmitted through the portion of the array. The controller is coupled to the array and provides at least one stimulus or condition to the array. The analyzer provides a stimulus to the array of antenna elements being tested and measures a characteristic for the array using one or both of the first directional/horn antenna and the second directional/horn antenna.

Examples of the measured characteristic include a microwave reflected frequency response characteristic at the first directional/horn antenna for the portion of the antenna array exposed to the directional/horn via the hole in the filter. In other examples, a second directional/horn antenna can be used to receive microwave energy from the antenna array. A measured characteristic can include a microwave frequency response at the second directional/horn antenna for the portion of the antenna array exposed by the hole in the filter. The measured microwave frequency response at the first directional/horn antenna or second directional/horn antenna can be a function of a command signal stimulus or without a command signal stimulus from the controller. The measured microwave frequency response can also be a function of an environmental condition. Other examples of measured characteristics for the antenna array include a measured transmission response at the second directional/horn antenna and a measured reflection response at the first directional/horn antenna for the antenna array. In some examples, the measured characteristic is only the measured transmission response at the second directional/horn antenna. In some examples, the measured characteristic is only the measured reflection response.

In one example, a computer is coupled to the controller and analyzer and can tune the RF radiating elements to have a more desirable microwave frequency response (e.g., transmission response, reflection response) characteristics of the antenna array being tested based on one or more stimuli. In some embodiments, this tuning is performed by applying voltage offsets to have a more desirable response for beamforming. In some embodiments, the tuning is a correction that sets a voltage to make sure the antenna elements provide a particular or proper resonant frequency. In some embodiments, the tuning of one or more RF antenna elements is to correct for environmentally induced frequency shifts (e.g., frequency shifts caused by temperature). This is particular important when a liquid crystal (LC) reservoir is used for the LC in the RF radiating antenna elements to help maintain the gap spacing in the antenna elements that changes due to temperature. The computer can also characterize the microwave frequency response (e.g., transmission response, reflection response) for the antenna array. In one example, the antenna array is used or integrated into a flat panel antenna if the measured characteristic of the antenna array indicates the antenna array is acceptable.

Free Space Segment Tester (FFST)

Figure 6A:
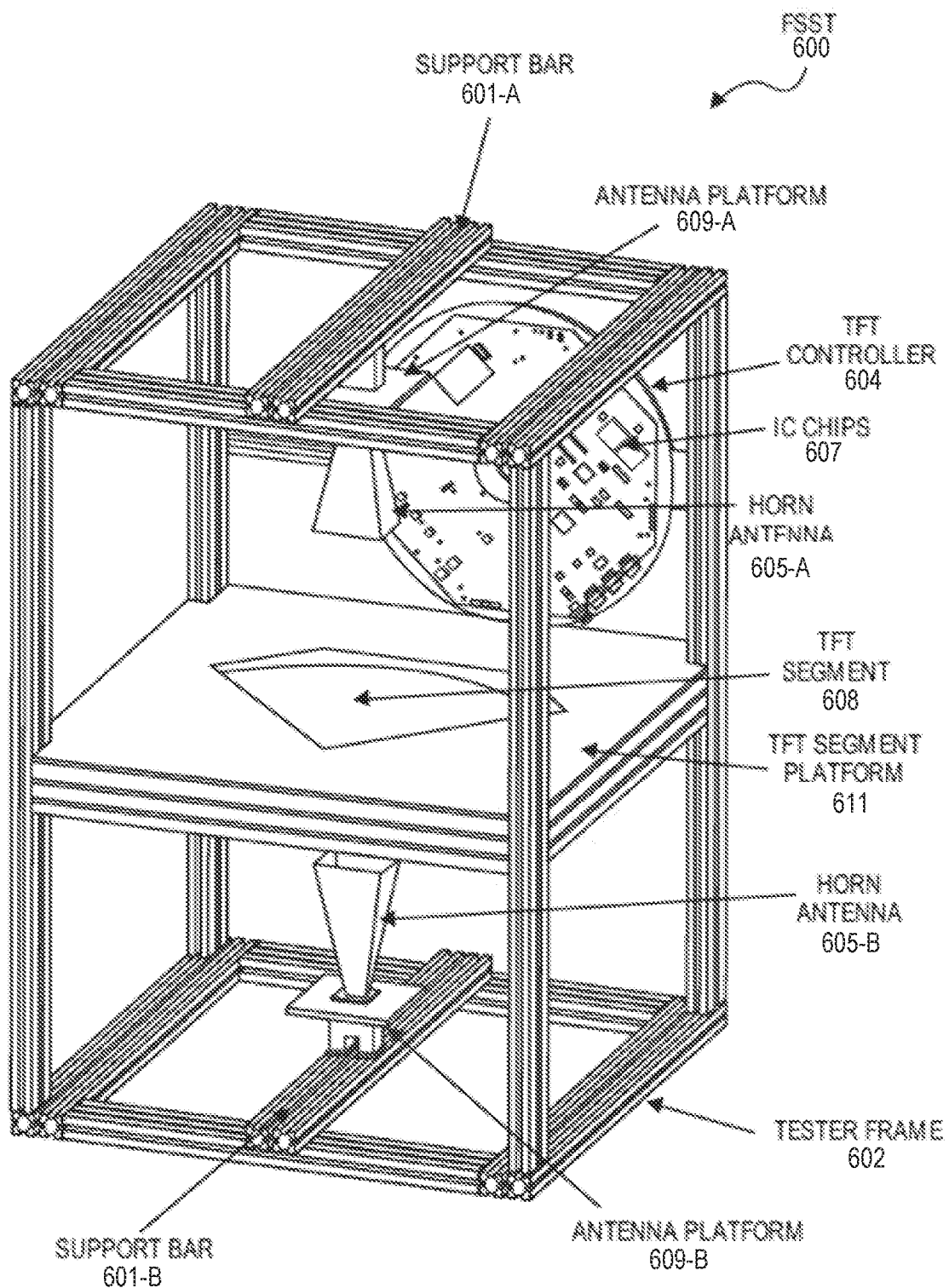
FIG. 6A illustrates an exemplary free space tester.

FIG. 6A illustrates an exemplary free space tester in the form of free space segment tester (FSST) 600. In this example, FST 600 is a microwave measurement device capable of evaluating and calibrating responses for flat panel antenna components under test, e.g., thin-film-transistor (TFT) segment 608 that contains antenna elements. Note that FST 600 is described below in terms of a TFT segment 608; however, one skilled in the art would recognize that the testing techniques described herein are not limited to testing RF radiating antenna elements on segments that are combined to form an antenna aperture and may be used with arrays of antenna elements of a non-segmented aperture. Examples of flat panel components can be for flat panel antennas as described in FIGS. 8-14 and in U.S. Pat. Nos. 9,905,921; 9,887,455; and 10,403,984. In one example, FST 600 is compatible with automated and fast measurement techniques and can have a small footprint in a production line for assembling flat panel antennas made from an array of TFT segments each containing antenna elements that are tested.

In the following examples, FST 600 enables in-process inspection and testing of characteristics of stand-alone flat panel antenna components. For example, a microwave frequency response can be measured for TFT segment 608 prior to integration into a completely assembled flat panel antenna. In this way, by using FST 600, defective flat panel antennas can be reduced by identifying defective components, e.g., TFT segments, and replacing them before final assembly into a flat panel antenna, which can also reduce assembly costs. In other words, an array of RF antenna elements that is determined to be defective as a result of testing can be rejected so that those antenna elements are not included in the antenna (i.e., in-line rejection). Measurements and testing using FST 600 can be seamlessly integrated into the flat panel antenna assembly process. The measurements from FST 600 can also be used for design, development, and tuning purposes for a flat panel antenna.

FST 600 also provides a non-destructive process of determining microwave functionality of flat panel antennas by performing testing and measurements on sub-components such as TFT segment 608.

FST 600 includes a tester frame 602 providing a physical structure holding TFT segment platform 611 supporting TFT segment 608. In this example, tester frame 602 includes an anti-static shelf such as TFT segment platform 611 having a segment shaped cutout to support TFT segment 608. The shaped cutout and TFT segment 608 can have any type of shape that form part of a flat panel antenna. Tester frame 602 also supports two horn antennas 605-A and 605-B located above and below TFT segment 608 with respective antenna platforms 609-A and 609-B connected to respective support bars 601-A and 601-B. In other examples, the positions of support bars 601-A and 601-B and antenna platforms 609-A and 609-B can be adjusted. Note that while FIGS. 6A-6C illustrate horn antennas, other types of directional antennas or non-directional antennas may be used.

Figures 6B, 6C:
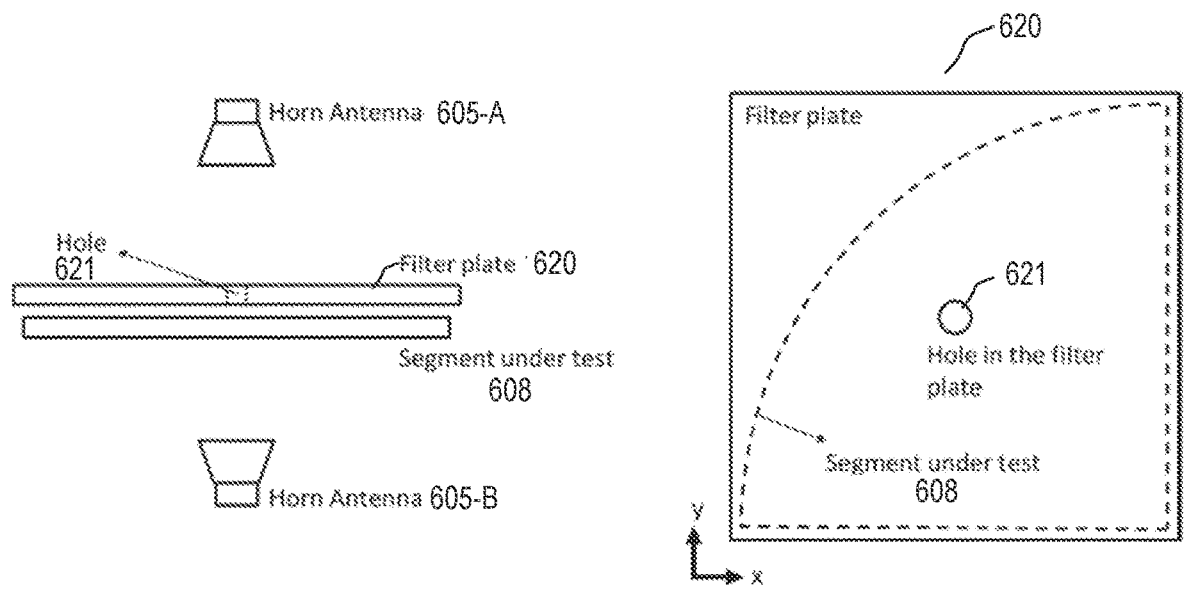
FIG. 6B illustrates one embodiment of a tester with a filter.
FIG. 6C illustrates one embodiment of a filter plate.

Although not shown in FIG. 6A, in some embodiments, FST 600 includes a filter, such as shown in FIGS. 6B and 6C. Referring to FIGS. 6B and 6C, in some embodiments, the filter plate 620 is positioned between horn antenna 605-A and TFT segment 608 and includes a hole or other opening 621. Note that this is not required for a transmission measurement. In another embodiment, filter plate 620 is positioned between horn antenna 605-B and TFT segment 608. In some embodiments, hole 621 has a circular edge. However, hole 621 need not be circular or have rounded edges and may have any shape which isolates the area of interest from the rest of the segment (e.g., a rectangular shape, a ring (e.g., a ring that follows the pitch/location of routing lines as to look at one row or column at a time)). In some embodiments, the size of the opening is adjustable to be more open or closed.

In some embodiments, filter plate 620 comprises a metal plate (e.g., aluminum) with a hole 621. Alternatively, any conductive material may be used. For example, an electromagnetic shield material or RF absorber (e.g., carbon coated fiber mesh) can be used to build the filter plate. In yet another embodiment, filter plate 620 comprises metalized plastic or some material with an adjustable iris.

In some embodiments, hole 621 is in the center of filter plate 620; however, other locations within filter plate 620 may be used as long as they are aligned with horn antennas 605-A and 605-B. Furthermore, in alternative embodiments, the testing can still be performed if the opening in the filter isn't centered to the horn antenna but is within a viewing area when signal strength is large enough. In some embodiments, filter plate 620 is placed on TFT segment 608 during an FST measurement (See FIG. 6B) and acts as a filter limiting the RF response to a smaller area of interest by preventing the RF signal from exiting the TFT segment 608 over areas covered with material (e.g., metal) of filter plate 620. In other words, the RF response measured in FST using this method is generated by the RF elements overlapping with hole 621. Thus, the use of filter plate 620 described herein aims to decrease the number of antenna elements over which an RF response is averaged and enable an FST measurement over a single RF element.

In some embodiments, the size of hole 621 is as small as an RF element size and that enables "element-by-element" testing. In some embodiments, the size of hole 621 is about ½ inch or is the size of 7-8 antenna elements. Other sized holes may be used.

In some embodiments, filter plate 620 is used in conjunction with particular driving techniques during segment testing. In some embodiments, the driving techniques involves driving RF elements of the segment residing in a smaller area of interest to a resonance frequency (F1) while keeping all other elements at a frequency as far away from F1 as possible. In some embodiments, those will be the frequencies at two ends of the RF element tuning range.

The use of filter plate 620 and/or particular driving techniques allows for detecting defects present in a small number of RF antenna elements on a TFT segment, such as, for example, variation in cell gap or misconnections (line-outs, which is an electrical short between electrical traces or a disconnection in an electrical trace causing improper operation of RF antenna elements along those traces) in TFT array locally in the TFT segment. Other regional defects could be bad TFTs that fail to charge or that leak excessively. In some embodiments, the techniques set forth herein include an element-by-element testing method for the liquid crystal-based antenna element. These antenna elements may be part of a TFT segment. Examples of such an antenna segment and antenna aperture containing the segments are described herein. Element-by-element testing capability enables identifying defects during manufacturing at an early stage. This is critical for increasing yield in a mass production environment. In some embodiments, the testing techniques also permit tuning for local cell gap variations within a single segment.

FST 600 includes a TFT controller 604. In one example, TFT controller 604 is circuit board with an electronic assembly used in a flat panel antenna system having IC chips 607 connected to tester frame 602. Although not shown, a computing system, personal computer (PC), server, or data storage system can be coupled to TFT controller 604 to control TFT controller 604 or store data for TFT controller 604. For example, as shown in FIG. 6D, a computer 610 can be coupled to TFT controller 604 and an analyzer 603 coupled to horn antennas 605-A and 605-B to measure responses for the portion of TFT segment 608 being tested.

IC chips 607 for TFT controller 604 can include microcontrollers, processors, memory to store software and data, and other electronic subcomponents and connections. In one example, TFT controller 604 runs software that generates command signals sent to TFT segment 608 that can charge or apply voltage to transistors or cells (to turn them on) in TFT segment 608 in measuring a response, e.g., a microwave frequency response. In other examples, no transistors or cells in TFT segment 608 are turned in measuring a response, or a pattern of transistors or cells can be turned on to measure a response for TFT segment 608.

Figure 6D:
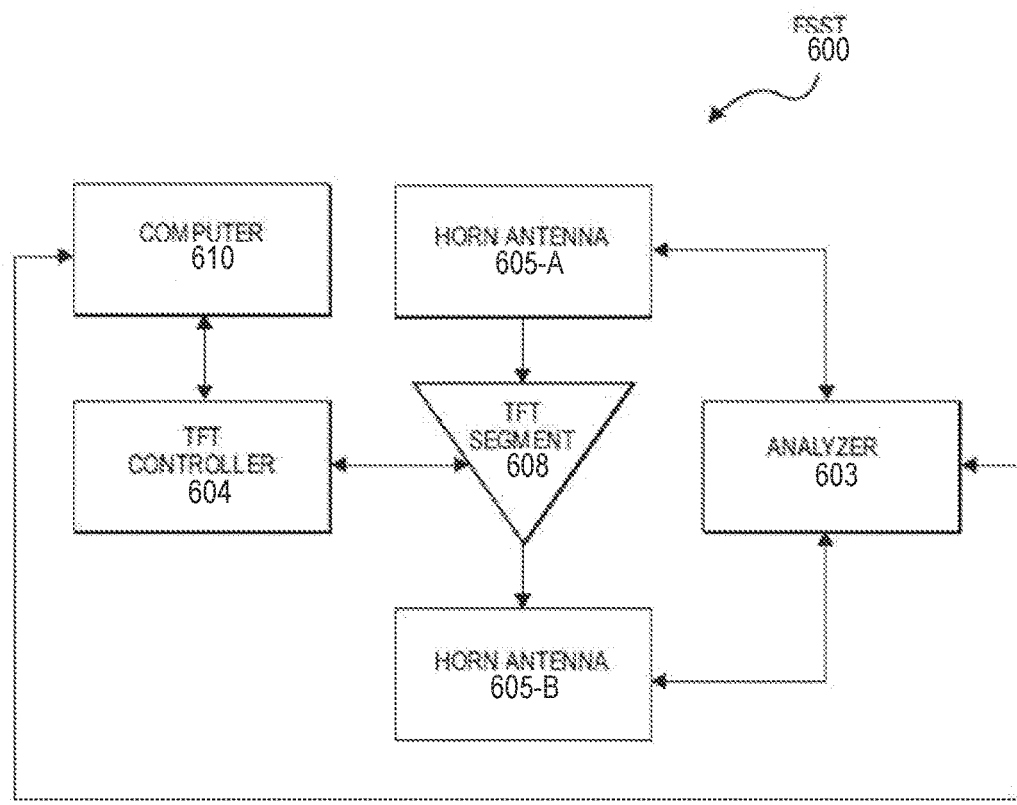
FIG. 6D illustrates an exemplary block diagram of components of the tester of FIGS. 6A and 6C.

In other examples, TFT controller 604 can be part of TFT platform 611 and connected to a standalone PC or server, e.g., computer 610 in FIG. 6D. TFT controller 604 or an attached computer 610 or server can be coupled and control horn antennas 605-A and 605-B and TFT segment 608 (or other electronic components for FST 600) and to send and receive signals to and from these components. Tester frame 602 can provide RF and electrical cabling and interconnections coupling the TFT controller 604 with horn antennas 605-A and 605-B, TFT segment 608, and any other computing device or server.

In some examples, horn antennas 605-A and 605-B above and below TFT segment 608 can project microwave energy or transmit microwave signals to a portion of TFT segment 608 exposed by hole 621 of filter place 620 and collect or receive microwave energy or signals transmitted through the portion of TFT segment 608 that is beneath hole 621 of filter plate 620. For example, horn antenna 605-A can be placed over a desired location of TFT segment 608 exposed by hole 621 and transmit microwave signals to that portion of TFT segment 608 to the desired location and those signals can be received by horn antenna 605-B under the portion of TFT segment 608 beneath hole 621. The horn antennas 605-A and 605-B can be placed in stable locations to project microwave energy or signals directly to the TFT segment 608 with minimal residual microwave energy being directed away from TFT segment 608. In one example, referring to FIGS. 6A, 6B and 6D, horn antennas 605-A and 605-B can be coupled to any type of microwave measurement analyzer, e.g., analyzer 603, and provide measurements to a connected computer, e.g., computer 610.

The microwave energy or signals received by either horn antennas 605-A or 605-B can be measured and tested, e.g., by an analyzer 603 in FIG. 6D. Such measurement and testing allows for non-destructive and non-contact means of determining microwave functionality of TFT segment 608, which can form part of a TFT array for a flat panel antenna. In these examples, the performance of TFT segment 608 can be assessed that is continuous with the production process of assembling arrays of TFT segments for production of a flat panel antenna. In this way, defective TFT segments can be replaced with non-defective TFT segments prior to final assembly of the flat panel antenna.

In one example, referring to FIGS. 6A, 6B and 6D, computer 610, coupled to TFT controller 604, can perform a number of tests and measurements of characteristics for TFT segment 608 using horn antennas 605-A and 605-B and analyzer 603. In one example, analyzer 603 measures reflection or transmission coefficients of TFT segment 608. In other examples, analyzer 603 measures a microwave frequency response in an active state (e.g., as a function of a command signal) or a passive state (e.g., without the use of a command signal). The measured response can be a transmission or reflected responses for testing TFT segment 608 using horn antennas 605-A and 605-B. In some embodiments, the transmission vs. frequency curve is generated based on the measurements and compared to a desired curve. In some embodiments, tuning of one or more RF elements being tested is performed based on the results of the comparison.

In some examples, the measured responses by analyzer 603 on TFT segment 608 can be used to provide statistical process control information for TFT segment 608 such as, e.g., Cp (target value offset), Cpm (normal distribution curve), and Cpk (six sigma processing data). In one example, such information can be used to determine if the portions of TFT segment 608 being tested is acceptable for use in assembly of a flat panel antenna. In one example, computer 610 can quantify the responses using stimuli such as electrical command signals, environmental conditions, or other types of stimuli. The responses measured by analyzer 603 can also be used to characterize responses from the TFT segment 608 and stored for later processing.

FST Operation

FIG. 6D illustrates an exemplary block diagram of components of the FST 600 of FIGS. 6A and 6B. In this example, computer 610 is coupled to TFT controller 604 and analyzer 603. TFT controller 604 is coupled to TFT segment 608 and analyzer 603 is coupled to horn antennas 605-A and 605-B and computer 610. Horn antennas 605-A and 605-B can provide and receive microwave energy or signals that are measured by analyzer 603. In one example, horn antenna 605-A projects microwave energy or signals to a portion of TFT segment 608 exposed by hole 621, which passes through TFT segment 608, is received by horn antenna 605-B and is measured by analyzer 603. In another example, horn antenna 605-A projects microwave energy or signals to a portion of TFT segment 608 exposed by hole 621, which is reflected by TFT segment 608 back to horn antenna 605-A and measured by analyzer 603. In some embodiments, analyzer 603 provides an RF stimulus to the RF antenna elements and measures how the RF elements modify the stimulus. In some embodiments, analyzer 603 measures complex characteristics of the microwave energy or signals such as phase and amplitude transmission and reflection coefficients for the TFT segment 608. In one example, transmission and reflection coefficients are measured as a function of microwave frequency and/or a command signal provided by TFT controller 604.

In one example, analyzer 603 provides a swept microwave signal or energy to horn antenna 605-A by way of a radio frequency (RF) cable that projects the microwave signal or energy to a portion of TFT segment 608 exposed by hole 621. A portion of the microwave energy can be transmitted through TFT segment 608 and received by horn antenna 605-B. A portion of the microwave energy can also be reflected by a portion of TFT segment 608 exposed by hole 621 and received by horn antenna 605-A. In this example, analyzer 603 determines the portion of the projected microwave energy transmitted through TFT segment 608 and received by horn antenna 605-B and reflected off the surface of the TFT segment 608 and received by horn antenna 605-A. In other examples, analyzer 603 can calculate transmission and reflection values or data (e.g., complex phase and amplitude coefficients). Analyzer 603 can store or display these values or transmit the values to computer 610. Thus, in some embodiments, analyzer 603 sweeps the frequency and then measures the response.

In one example, computer 610 controls TFT controller 604 to provide a command signal to TFT segment 608 to control voltage for the transistors of TFT segment 608 to generate the maximum voltage differential on RF antenna element and analyzer 603 measures microwave energy transmitted or reflected by horn antennas 605-A and 605-B referred to as an "on" response. In other examples, a command signal is provided by the TFT controller 604 to generate a minimum (e.g., typically zero) voltage differential on RF antenna element and analyzer 603 measures microwave energy transmitted or reflected by horn antennas 605-A and 605-B referred to as "off" response. The off response may be desired when a physical connection to TFT segment 608 is not available and this is referred to as "disconnected" response. In one example, TFT controller 604 can implement software or algorithms to vary command signals while measuring the corresponding microwave energy response for TFT segment 608. In this way, the measured response can be tuned based on the varying of the command signals and the bias applied to each element or transistor of TFT segment 608 versus the measured response can be obtained. More specifically, in some embodiments, the measured response as a function of bias can be used to generate corrected biases that generate the desired responses. In such a way, the frequency shift can be obtained as a function of the applied voltage. In one example, analyzer 603 can measure switching time required to switch between two states for TFT segment 608.

In some examples, FST 600 of FIGS. 6A, 6B and 6D is located in a manufacturing line for flat panel antennas and provide continuous and in process quality measurements (e.g., measured frequency response) to detect performance variations in TFT segment 608 such as, e.g., varying environmental exposures. In other examples, one horn antenna 605-A is used to measure reflected microwave energy or signals from TFT segment 608. Inspection and testing using FST 600 can be a final inspection for TFT segment 608 to determine if it is defective and replaced prior to assembly of a final flat panel antenna.

Figure 6E:
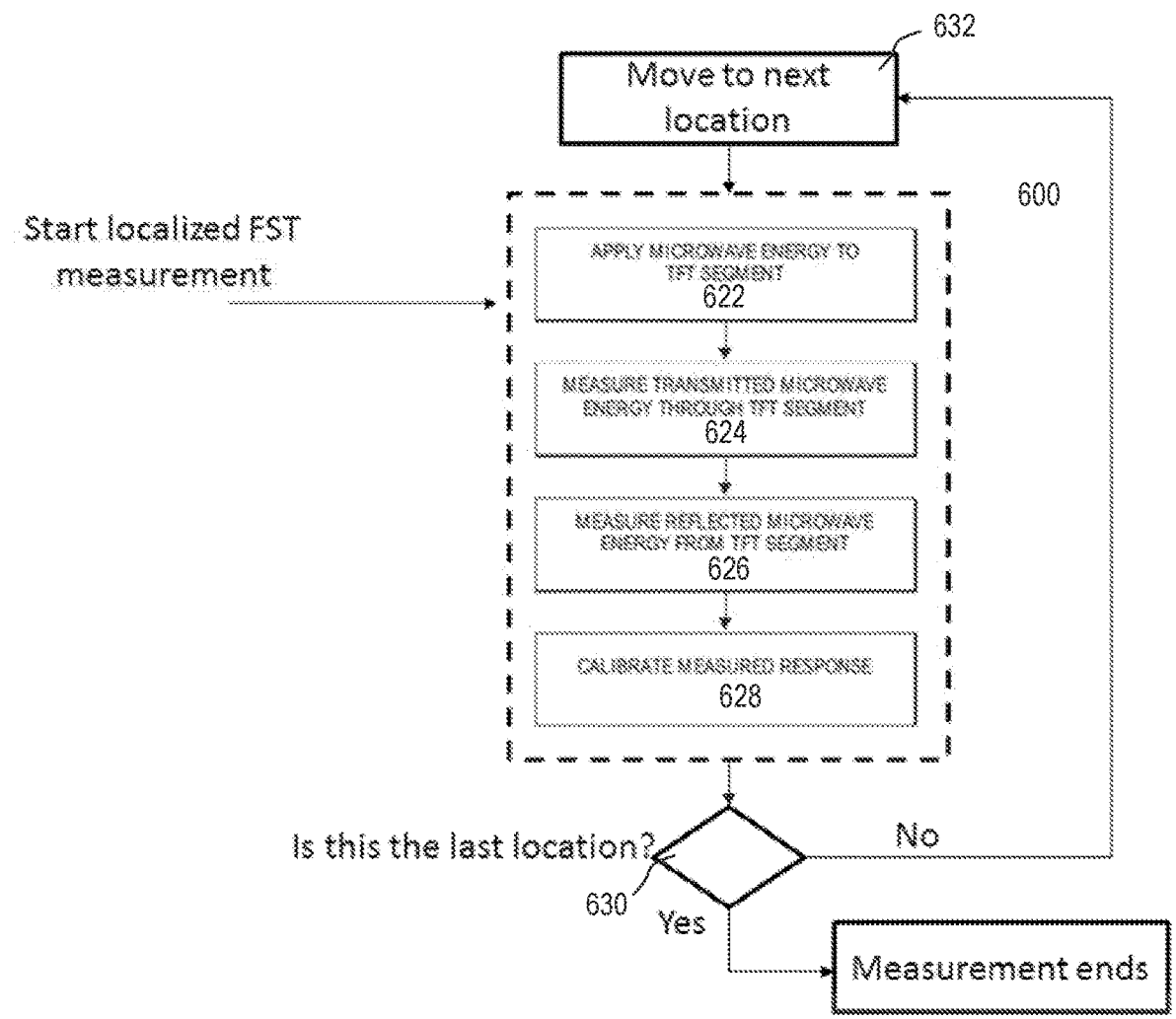
FIG. 6E illustrates an exemplary operation for operating the tester of FIGS. 6A-6D

FIG. 6E illustrates an exemplary operation for operating the FST 600 of FIGS. 6A and 6B. At operation 622, microwave energy is applied to a portion of TFT segment 608 exposed by hole 621 (e.g., horn antenna 605-A can project microwave energy to a portion of TFT segment 608 exposed by hole 621). At operation 624, the microwave energy transmitted through a TFT segment is measured (e.g., the transmitted microwave energy from horn antenna 605-A through TFT segment 608 is measured at horn antenna 605-B by analyzer 603). At operation 626, microwave energy reflected from a portion of TFT segment 608 exposed by hole 621 is measured e.g., the projected microwave energy from horn antenna 605-A reflected back from TFT segment 608 is measured at horn antenna 605-A by analyzer 603). At operation 628, the measured response is calibrated. In some embodiments, the measured response is used by TFT controller 604 to adjust a stimulus (command signal or external) to tune one or more of the antenna elements so that they provide the expected response when voltages are applied to the antenna elements.

Next, at operation 630, a test is performed to determine if the location being tested is the last operation. If it is, then the measurement ends; if not, at operation 632, the TFT segment 608 is moved relative to filter plate 620 and horn antennas 605-A and 605-B to expose another portion of TFT segment 608 for testing. Then operations of FIG. 6E are repeated. This continues until a predetermined amount of TFT segment 608 undergoes testing. This could be all of TFT segment 608, a substantial portion of TFT segment 608 or a predetermined portion of TFT segment 608 that is less than a substantial portion.

To perform an element-by-element testing (or region-by region testing) of TFT segment 608, segment 608 is moved in x and y directions with respect to the hole on filter plate 620 and horn antennas 605-A and 605-B. In some embodiments, the movement is approximately equal to the pitch between RF elements in the array, and a different RF antenna element is aligned with the hole at each step. In an alternative embodiment, the same principle can also be applied by keeping the segment stationary and moving filter plate 620 and horn antennas 605-A and 605-B. In this case, filter plate 620 and horn antennas 605-A and 605-B move together with the same amount of displacement in the same direction. In some embodiments, the movement of segment 608 or filter plate 620 and horn antennas 605-A and 605-B is accomplished with a mechanical mechanism. In some embodiments, this mechanism includes a motorized x-y stage that can move in x and y directions with steps less than an element size and a controller, which may be computer 610, to automate move-measure-move routine.

Figure 7A:
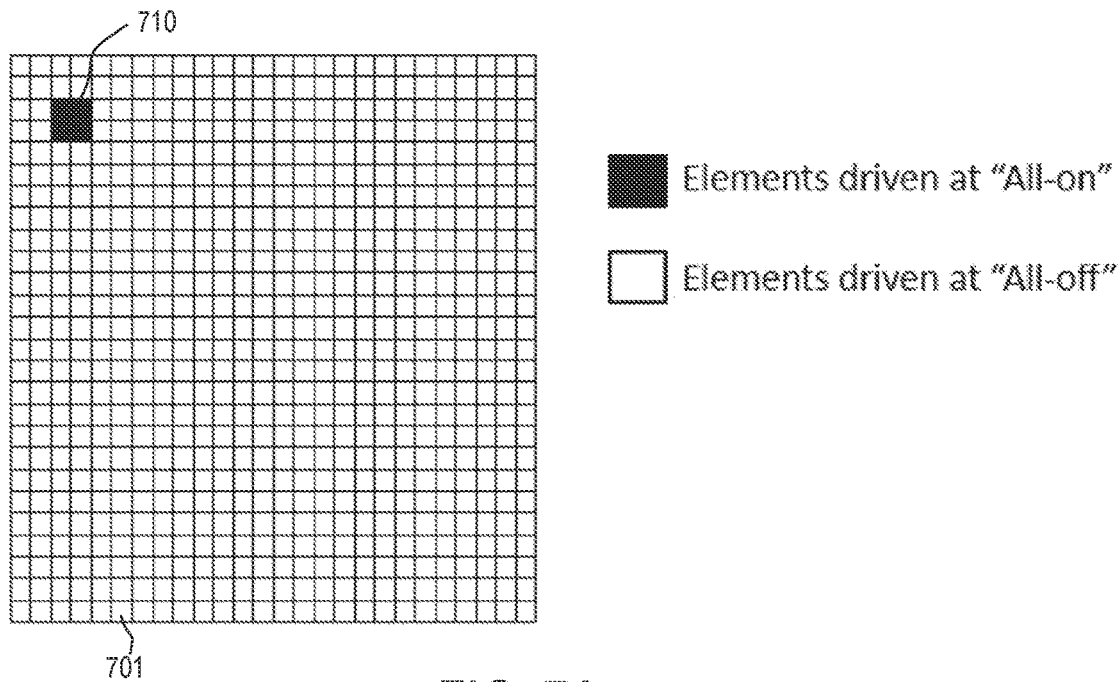
FIG. 7A illustrates isolated elements of an array of antenna elements.
Figure 7B:
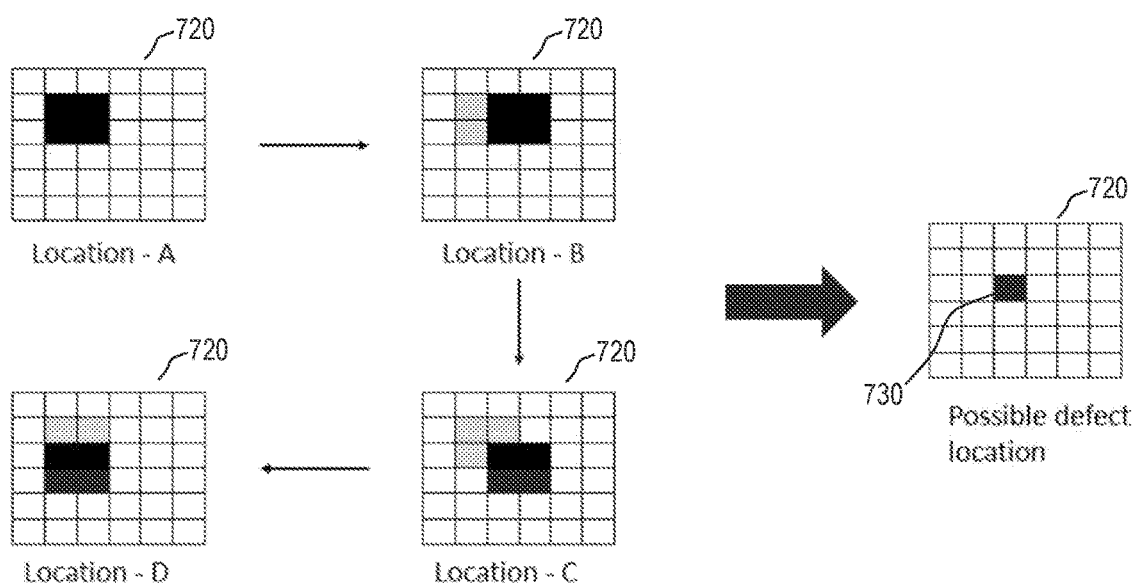
FIG. 7B illustrates one embodiment of a process to perform element-by-element testing.
Figure 7C:
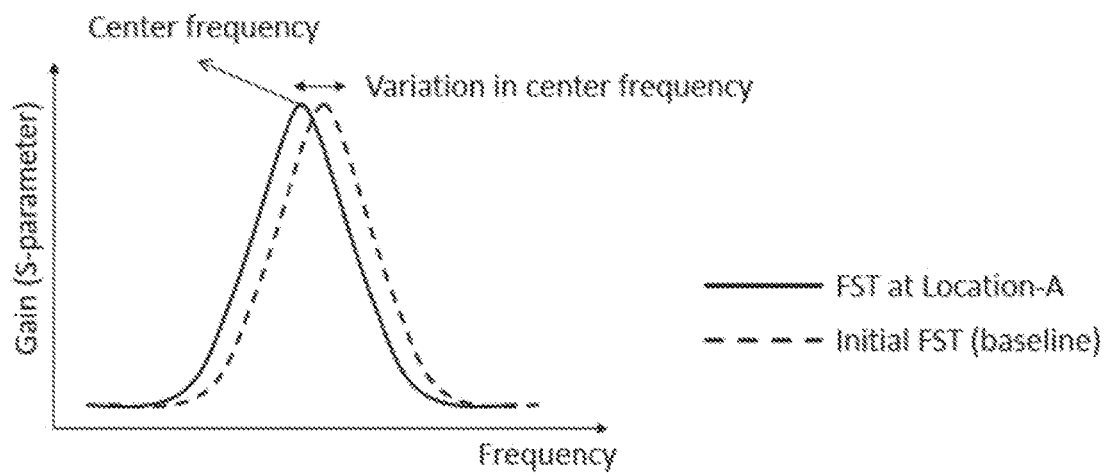
FIG. 7C illustrates a frequency response in the free space segment tester (FSST) and its variation from baseline.

In some embodiments, the center frequency (or peak frequency) measured in FST is monitored to detect any defects in the localized FST region. An initial FST measurement, where all RF elements are driven to the same state, is performed before starting localized measurements to establish a baseline center frequency. One can observe the change in the measured center frequency as measurements are performed over different locations on the RF antenna segment. FIG. 7C illustrates the frequency response in FST and its variation from baseline result to a location (Location-A) with different cell gap or charging state. Referring to FIG. 7C, the change in center frequency is caused by a variation in the cell gap of the RF element or a variation of charging state or leakage.

Figure 7D:
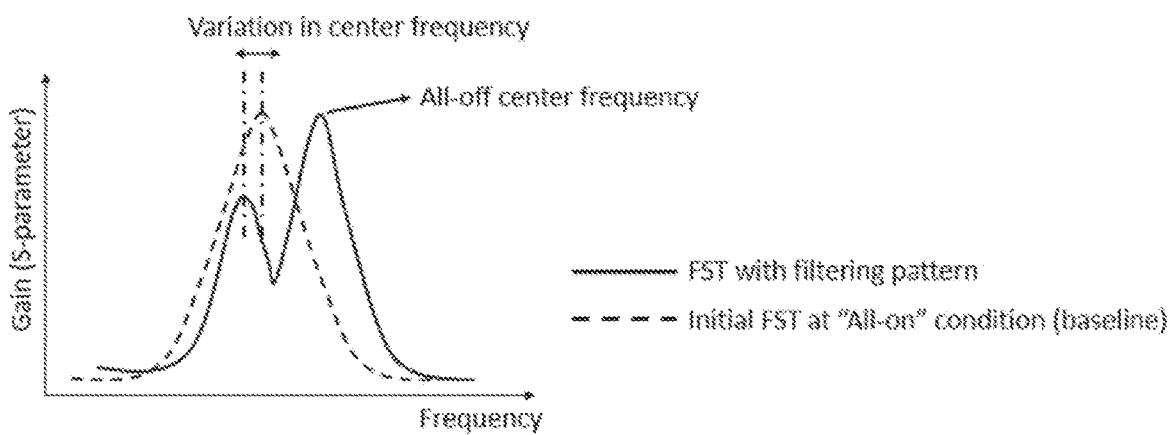
FIG. 7D illustrates a FSST measurement with a region of interest driven to an all-on state while the remainder of the array is driven to an all-off state.

In another method for testing segment 608, a similar filtration can be applied electrically. For example, in this testing method, a region of interest (e.g., a set of RF antenna elements) can be driven to a center frequency, for example an "All-On" frequency, while the rest of the RF elements are driven to a center frequency as far away as possible, for example "All-Off" frequency. FIG. 7A illustrates an example of four elements in the array being isolated from the array by driving them at a different voltage condition. Referring to FIG. 7A, both "All-off" and "All-on" frequencies in the FST are measured with the horn antenna aligned to the region of interest (ROI). The "All-on" response is generated by only the ROI while "All-off" response is generated by rest of the RF elements. FIG. 7D illustrates an FST measurement with a region of interest driven at "All-on" while the array is at "All-off". Again, the variation of center frequency can be observed by comparing "All-on" center frequency from ROI to the baseline "All-on" center frequency. Then, this variation in center frequency can be used to detect a variation in the cell gap of the RF element, a variation in charging state, or line-outs. Due to the presence of a second center frequency created by the rest of RF elements, it may not be possible to perform an element-by-element testing in this method. In some embodiments, a minimum number of RF elements required to generate a measurable signal determines the resolution of the method. In some embodiments, a map of center frequency over the RF antenna segment is created by moving the ROI and the horn antenna at the same time and performing FST at each location.

When detecting an FST response from a single RF element isn't possible, a larger group of elements are used to scan the array. FIG. 7B illustrates one embodiment of a process for element-by-element testing using the additional testing method. Referring to FIG. 7B, black squares in region 720 are driven to "All-on" during testing and gray squares show the region where a deviation from "All-on" baseline center frequency is first detected. A variation in center frequency is detected first at Location-A. Then an area neighboring Location-A is scanned with steps of a single RF element in an x or y direction, such as, for example from Location-B to Location-D. If a similar variation is observed at each of those locations, the tester, or computer 610, determines that the observed variation is due to the RF element at the overlap of those 4 regions. To confirm the conclusion, in some embodiments, the tester performs a second scan around the possible defect location. During the second scan, a possible defect location is kept in "All-off" state while elements around that location are turned into "All-on" state. If the center frequency variation is not observed, a defect location estimate is confirmed. Variations of this method such as, for example, but not limited to, turning on or turning off elements row-by-row or column-by-column to discover defect locations can be applied to detect cell gap variations, charging, state variations, and line-outs.

In some embodiments, the tester illustrated above performs one or more testing methods describe above on an antenna element aperture, or segment thereof, alone or in combination with each other, to identify deficient RF antenna segments during the manufacturing process.

Examples of Antenna Embodiments

The techniques described above may be used with flat panel satellite antennas. Embodiments of such flat panel antennas are disclosed. The flat panel antennas include one or more arrays of antenna elements on an antenna aperture. In some embodiments, the antenna aperture is a metasurface antenna aperture, such as, for example, the antenna apertures described below. In some embodiments, the antenna elements comprise diodes and varactors such as, for example, described above and described in U.S. Patent Application Publication No. 20210050671, entitled "Metasurface Antennas Manufactured with Mass Transfer Technologies," published Feb. 18, 2021. In other embodiments, the antenna elements comprises LC-based antenna elements, such as, for example, those disclosed in U.S. Pat. No. 9,887,456, entitled "Dynamic polarization and coupling control from a steerable cylindrically fed holographic antenna", issued Feb. 6, 2018, or other RF radiating antenna elements. In some embodiments, the flat panel antenna is a cylindrically fed antenna that includes matrix drive circuitry to uniquely address and drive each of the antenna elements that are not placed in rows and columns. In some embodiments, the elements are placed in rings.

In some embodiments, the antenna aperture having the one or more arrays of antenna elements is comprised of multiple segments coupled together. When coupled together, the combination of the segments form closed concentric rings of antenna elements. In some embodiments, the concentric rings are concentric with respect to the antenna feed.

Figure 8:
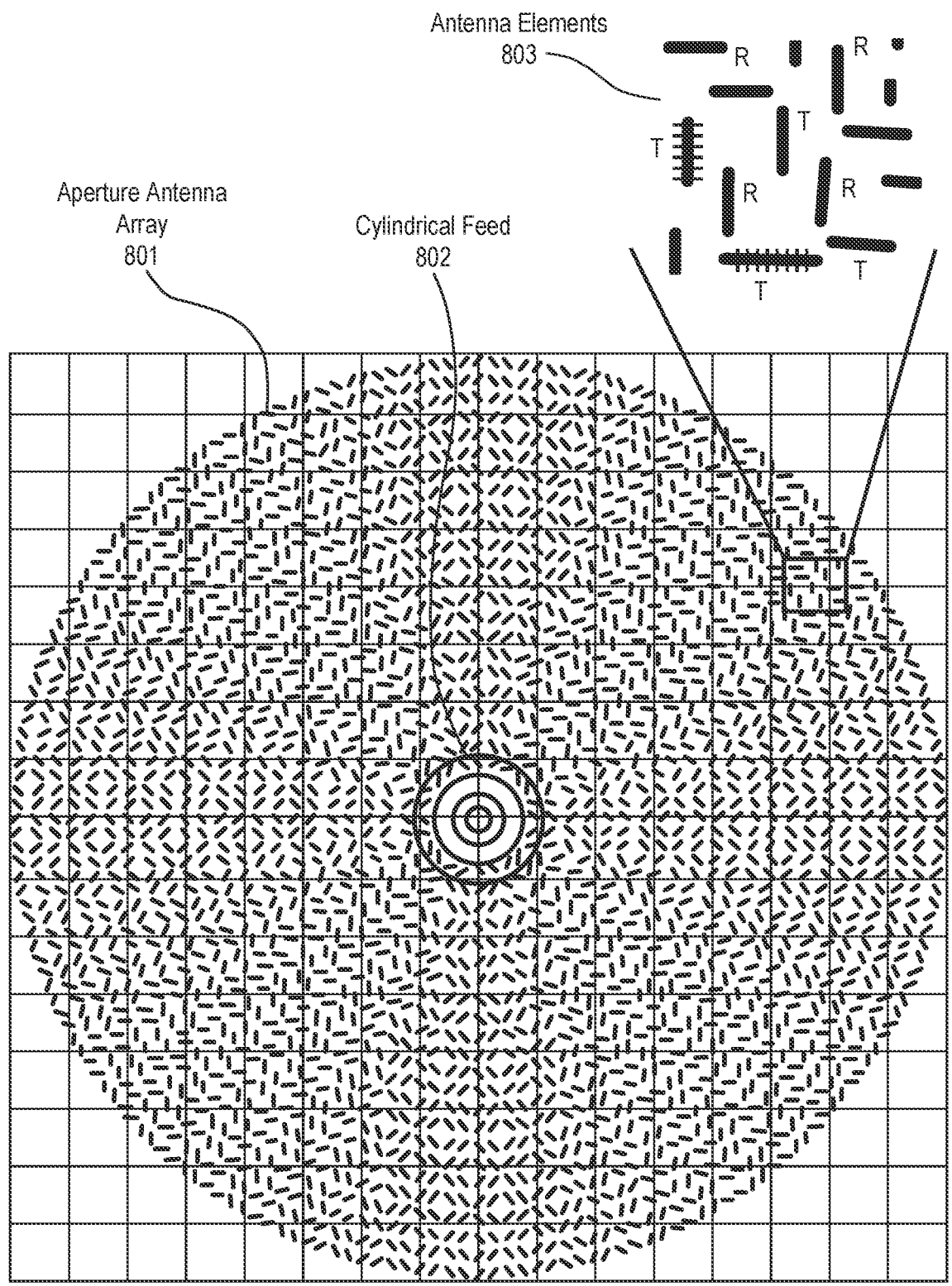
FIG. 8 illustrates the schematic of one embodiment of a cylindrically fed holographic radial aperture antenna.

FIG. 8 illustrates the schematic of one embodiment of a cylindrically fed holographic radial aperture antenna. Referring to FIG. 8, the antenna aperture has one or more arrays 801 of antenna elements 803 that are placed in concentric rings around an input feed 802 of the cylindrically fed antenna. In some embodiments, antenna elements 803 are radio frequency (RF) resonators that radiate RF energy. In some embodiments, antenna elements 803 comprise both Rx and Tx irises that are interleaved and distributed on the whole surface of the antenna aperture. Such Rx and Tx irises, or slots, may be in groups of three or more sets where each set is for a separately and simultaneously controlled band. Examples of such antenna elements with irises are described in greater detail below. Note that the RF resonators described herein may be used in antennas that do not include a cylindrical feed.

In some embodiments, the antenna includes a coaxial feed that is used to provide a cylindrical wave feed via input feed 802. In some embodiments, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

In some embodiments, antenna elements 803 comprise irises (iris openings) and the aperture antenna of FIG. 8 is used to generate a main beam shaped by using excitation from a cylindrical feed wave for radiating the iris openings through tunable diodes and/or varactors. In some embodiments, the antenna can be excited to radiate a horizontally or vertically polarized electric field at desired scan angles.

In some embodiments, each scattering element in the antenna system is part of a unit cell as described above. In some embodiments, the unit cell is driven by the direct drive embodiments described above. In some embodiments, the diode/varactor in each unit cell has a lower conductor associated with an iris slot from an upper conductor associated with its tuning electrode (e.g., iris metal). The diode/varactor can be controlled to adjust the bias voltage between the iris opening and the patch electrode. Using this property, in some embodiments, the diode/varactor integrates an on/off switch for the transmission of energy from the guided wave to the unit cell. When switched on, the unit emits an electromagnetic wave like an electrically small dipole antenna. Note that the teachings herein are not limited to having unit cell that operates in a binary fashion with respect to energy transmission.

In some embodiments, the feed geometry of this antenna system allows the antenna elements to be positioned at forty-five-degree (45°) angles to the vector of the wave in the wave feed. Note that other positions may be used (e.g., at 40° angles). This position of the elements enables control of the free space wave received by or transmitted/radiated from the elements. In some embodiments, the antenna elements are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In some embodiments, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides.

The amount of radiated power from each unit cell is controlled by applying a voltage to the patch electrode using a controller. Traces to each patch electrode are used to provide the voltage to the patch electrode. The voltage is used to tune or detune the capacitance and thus the resonance frequency of individual elements to effectuate beam forming. The voltage required is dependent on the diode/varactor being used.

In some embodiments, as discussed above, a matrix drive is used to apply voltage to the patch electrodes in order to drive each cell separately from all the other cells without having a separate connection for each cell (direct drive). Because of the high density of elements, the matrix drive is an efficient way to address each cell individually.

In some embodiments, the control structure for the antenna system has two main components: the antenna array controller, which includes drive electronics for the antenna system, is below the wave scattering structure of surface scattering antenna elements such as described herein, while the matrix drive switching array is interspersed throughout the radiating RF array in such a way as to not interfere with the radiation. In some embodiments, the drive electronics for the antenna system comprise commercial off-the shelf LCD controls used in commercial television appliances that adjust the bias voltage for each scattering element by adjusting the amplitude or duty cycle of an AC bias signal to that element.

In some embodiments, the antenna array controller also contains a microprocessor executing the software. The control structure may also incorporate sensors (e.g., a GPS receiver, a three-axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the antenna array controller controls which elements are turned off and those elements turned on and at which phase and amplitude level at the frequency of operation. The elements are selectively detuned for frequency operation by voltage application.

For transmission, a controller supplies an array of voltage signals to the RF patches to create a modulation, or control pattern. The control pattern causes the elements to be turned to different states. In some embodiments, multistate control is used in which various elements are turned on and off to varying levels, further approximating a sinusoidal control pattern, as opposed to a square wave (i.e., a sinusoid gray shade modulation pattern). In some embodiments, some elements radiate more strongly than others, rather than some elements radiate and some do not. Variable radiation is achieved by applying specific voltage levels, which adjusts the liquid crystal permittivity to varying amounts, thereby detuning elements variably and causing some elements to radiate more than others.

The generation of a focused beam by the metamaterial array of elements can be explained by the phenomenon of constructive and destructive interference. Individual electromagnetic waves sum up (constructive interference) if they have the same phase when they meet in free space, and waves cancel each other (destructive interference) if they are in opposite phase when they meet in free space. If the slots in a slotted antenna are positioned so that each successive slot is positioned at a different distance from the excitation point of the guided wave, the scattered wave from that element will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which metamaterial unit cells are turned on or off (i.e., by changing the pattern of which cells are turned on and which cells are turned off), a different pattern of constructive and destructive interference can be produced, and the antenna can change the direction of the main beam. The time required to turn the unit cells on and off dictates the speed at which the beam can be switched from one location to another location.

In some embodiments, the antenna system produces one steerable beam for the uplink antenna and one steerable beam for the downlink antenna. In some embodiments, the antenna system uses metamaterial technology to receive beams and to decode signals from the satellite and to form transmit beams that are directed toward the satellite. In some embodiments, the antenna systems are analog systems, in contrast to antenna systems that employ digital signal processing to electrically form and steer beams (such as phased array antennas). In some embodiments, the antenna system is considered a "surface" antenna that is planar and relatively low profile, especially when compared to conventional satellite dish receivers.

Figure 9A:
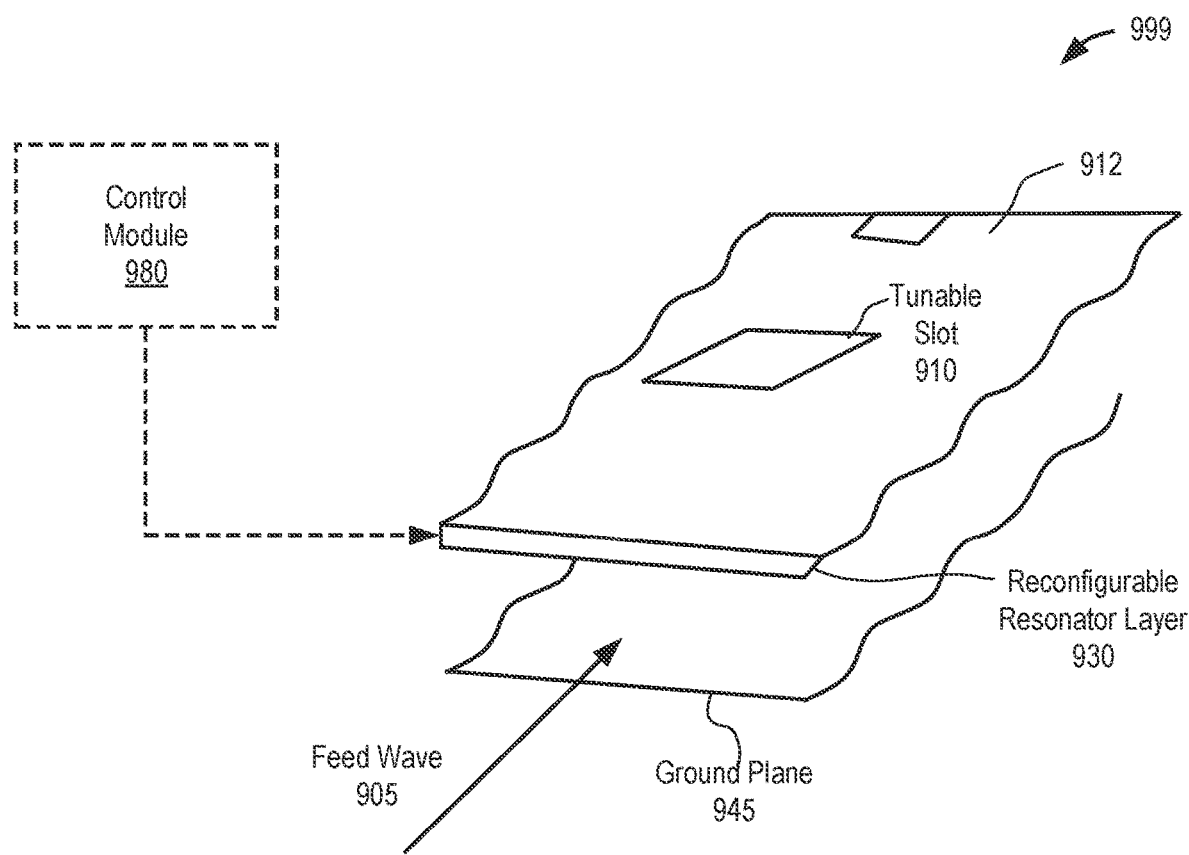
FIG. 9A illustrates a perspective view of one row of antenna elements that includes a ground plane and a reconfigurable resonator layer.

FIG. 9A illustrates a perspective view of one row of antenna elements that includes a ground plane 945 and a reconfigurable resonator layer 930. Reconfigurable resonator layer 930 includes an array 912 of tunable slots 910. The array 912 of tunable slots 910 can be configured to point the antenna in a desired direction. Each of the tunable slots 910 can be tuned/adjusted by varying a voltage, which changes the capacitance of the varactor diode and results in a frequency shift, which in turn changes the amplitude and phase of the radiating antenna element. A proper phase and amplitude adjustment of the antenna elements in an array will result in a beam formation and beam steering.

Control module 980, or a controller, is coupled to reconfigurable resonator layer 930 to modulate the array 912 of tunable slots 910 by varying the voltage to the diodes/varactors. Control module 980 may include a Field Programmable Gate Array ("FPGA"), a microprocessor, a controller, System-on-a-Chip (SoC), or other processing logic. In some embodiments, control module 980 includes logic circuitry (e.g., multiplexer) to drive the array 912 of tunable slots 910. In some embodiments, control module 980 receives data that includes specifications for a holographic diffraction pattern to be driven onto the array 912 of tunable slots 910. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each figure, a control module similar to control module 980 may drive each array of tunable slots described in various embodiments in the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 905 (approximately 20 GHz in some embodiments). To transform a feed wave into a radiated beam (either for transmitting or receiving purposes), an interference pattern is calculated between the desired RF beam (the object beam) and the feed wave (the reference beam). The interference pattern is driven onto the array of tunable slots 910 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram}=W^*_{in}W_{out}$, with $w_{in}$ as the wave equation in the waveguide and $w_{out}$ the wave equation on the outgoing wave.

A voltage between the patch electrode and the iris opening can be modulated to tune the antenna element (e.g., the tunable resonator/slot). Adjusting the voltage varies the capacitance of a slot (e.g., the tunable resonator/slot). Accordingly, the reactance of a slot (e.g., the tunable resonator/slot) can be varied by changing the capacitance. Resonant frequency of the slot also changes according to the equation $$f = \frac{1}{2\pi\sqrt{LC}}$$

where f is the resonant frequency of the slot and L and C are the inductance and capacitance of the slot, respectively. The resonant frequency of the slot affects the energy radiated from feed wave 905 propagating through the waveguide. As an example, if feed wave 905 is 20 GHz, the resonant frequency of a slot 910 may be adjusted (by varying the capacitance) to 17 GHz so that the slot 910 couples substantially no energy from feed wave 905. Or, the resonant frequency of a slot 910 may be adjusted to 20 GHz so that the slot 910 couples energy from feed wave 905 and radiates that energy into free space. Although the examples given are binary (fully radiating or not radiating at all), full gray scale control of the reactance, and therefore the resonant frequency of slot 910 is possible with voltage variance over a multi-valued range. Hence, the energy radiated from each slot 910 can be finely controlled so that detailed holographic diffraction patterns can be formed by the array of tunable slots.

In some embodiments, tunable slots in a row are spaced from each other by $\lambda/5$. Other spacings may be used. In some embodiments, each tunable slot in a row is spaced from the closest tunable slot in an adjacent row by $\lambda/2$, and, thus, commonly oriented tunable slots in different rows are spaced by $\lambda/4$, though other spacings are possible (e.g., $\lambda/5$, $\lambda/6.3$). In another embodiment, each tunable slot in a row is spaced from the closest tunable slot in an adjacent row by $\lambda/3$.

Figure 9B:
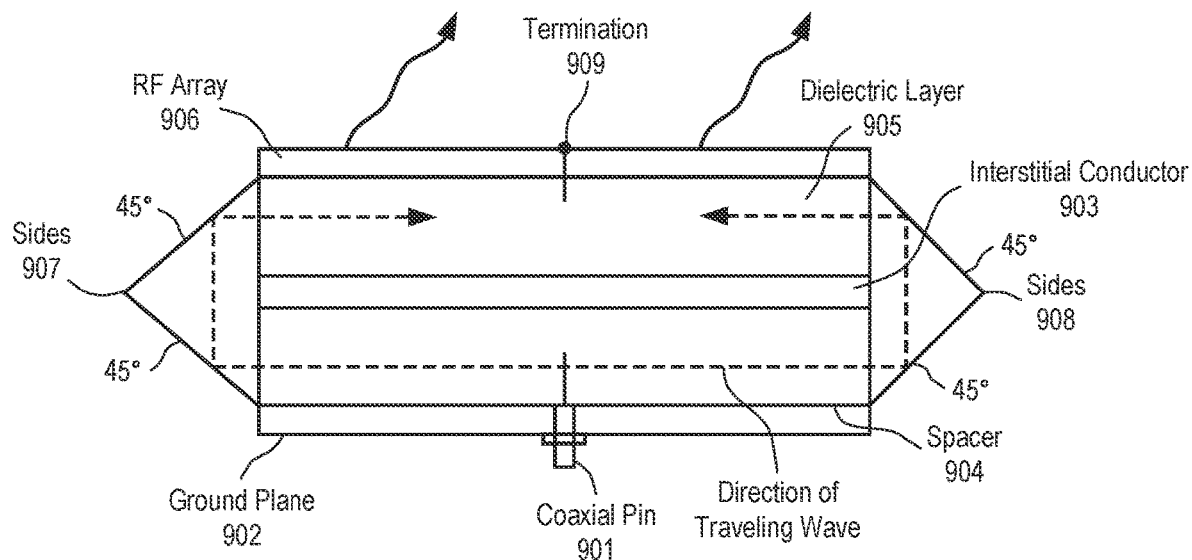
FIG. 9B illustrates a side view of one embodiment of a cylindrically fed antenna structure.

FIG. 9B illustrates a side view of one embodiment of a cylindrically fed antenna structure. The antenna produces an inwardly travelling wave using a double layer feed structure (i.e., two layers of a feed structure). In some embodiments, the antenna includes a circular outer shape, though this is not required. That is, non-circular inward travelling structures can be used. In some embodiments, the antenna structure in FIG. 9B includes a coaxial feed, such as, for example, described in U.S. Pat. No. 9,887,456, entitled "Dynamic Polarization and Coupling Control from a Steerable Cylindrically Fed Holographic Antenna", issued Feb. 6, 2018 or in U.S. Patent Application Publication No. 20210050671, entitled "Metasurface Antennas Manufactured with Mass Transfer Technologies," published Feb. 18, 2021.

Referring to FIG. 9B, a coaxial pin 901 is used to excite the field on the lower level of the antenna. In some embodiments, coaxial pin 901 is a 50Ω coax pin that is readily available. Coaxial pin 901 is coupled (e.g., bolted) to the bottom of the antenna structure, which is conducting ground plane 902.

Separate from conducting ground plane 902 is interstitial conductor 903, which is an internal conductor. In some embodiments, conducting ground plane 902 and interstitial conductor 903 are parallel to each other. In some embodiments, the distance between ground plane 902 and interstitial conductor 903 is 0.1-0.15". In another embodiment, this distance may be $\lambda/2$, where is the wavelength of the travelling wave at the frequency of operation.

Ground plane 902 is separated from interstitial conductor 903 via a spacer 904. In some embodiments, spacer 904 is a foam or air-like spacer. In some embodiments, spacer 904 comprises a plastic spacer.

On top of interstitial conductor 903 is dielectric layer 905. In some embodiments, dielectric layer 905 is plastic. The purpose of dielectric layer 905 is to slow the travelling wave relative to free space velocity. In some embodiments, dielectric layer 905 slows the travelling wave by 30% relative to free space. In some embodiments, the range of indices of refraction that are suitable for beam forming are 1.2-1.8, where free space has by definition an index of refraction equal to 1. Other dielectric spacer materials, such as, for example, plastic, may be used to achieve this effect. Note that materials other than plastic may be used as long as they achieve the desired wave slowing effect. Alternatively, a material with distributed structures may be used as dielectric layer 905, such as periodic sub-wavelength metallic structures that can be machined or lithographically defined, for example.

An RF array 906 is on top of dielectric layer 905. In some embodiments, the distance between interstitial conductor 903 and RF array 906 is 0.1-0.15". In another embodiment, this distance may be $\lambda_{eff}/2$, where $\lambda_{eff}$ is the effective wavelength in the medium at the design frequency.

The antenna includes sides 907 and 908. Sides 907 and 908 are angled to cause a travelling wave feed from coax pin 901 to be propagated from the area below interstitial conductor 903 (the spacer layer) to the area above interstitial conductor 903 (the dielectric layer) via reflection. In some embodiments, the angle of sides 907 and 908 are at 45° angles. In an alternative embodiment, sides 907 and 908 could be replaced with a continuous radius to achieve the reflection. While FIG. 9B shows angled sides that have angle of 45 degrees, other angles that accomplish signal transmission from lower-level feed to upper-level feed may be used. That is, given that the effective wavelength in the lower feed will generally be different than in the upper feed, some deviation from the ideal 45° angles could be used to aid transmission from the lower to the upper feed level. For example, in another embodiment, the 45° angles are replaced with a single step. The steps on one end of the antenna go around the dielectric layer, interstitial the conductor, and the spacer layer. The same two steps are at the other ends of these layers.

In operation, when a feed wave is fed in from coaxial pin 901, the wave travels outward concentrically oriented from coaxial pin 901 in the area between ground plane 902 and interstitial conductor 903. The concentrically outgoing waves are reflected by sides 907 and 908 and travel inwardly in the area between interstitial conductor 903 and RF array 906. The reflection from the edge of the circular perimeter causes the wave to remain in phase (i.e., it is an in-phase reflection). The travelling wave is slowed by dielectric layer 905. At this point, the travelling wave starts interacting and exciting with elements in RF array 906 to obtain the desired scattering.

To terminate the travelling wave, a termination 909 is included in the antenna at the geometric center of the antenna. In some embodiments, termination 909 comprises a pin termination (e.g., a 50Ω pin). In another embodiment, termination 909 comprises an RF absorber that terminates unused energy to prevent reflections of that unused energy back through the feed structure of the antenna. These could be used at the top of RF array 906.

Figure 10:
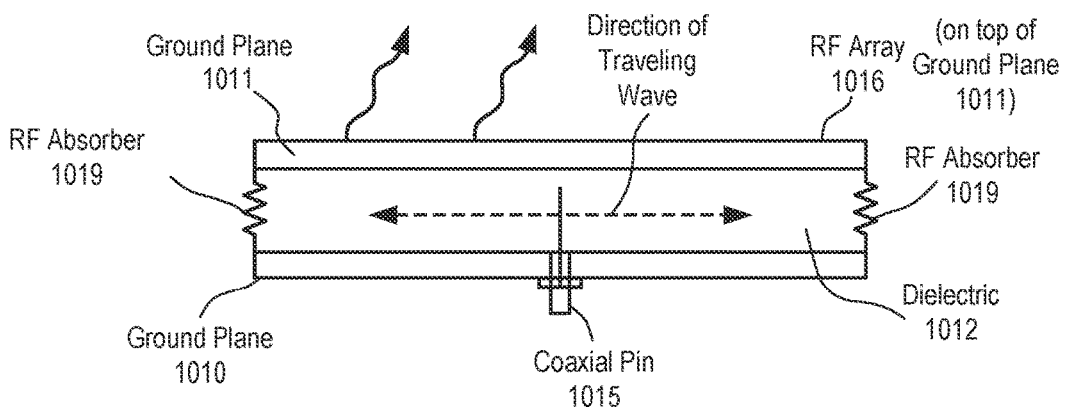
FIG. 10 illustrates another embodiment of the antenna system with an outgoing wave.

FIG. 10 illustrates another embodiment of the antenna system with an outgoing wave. Referring to FIG. 10, two ground planes 1010 and 1011 are substantially parallel to each other with a dielectric layer 1012 (e.g., a plastic layer, etc.) in between ground planes 1010, 1011. RF absorbers 1019 (e.g., resistors) couple the two ground planes 1010 and 1011 together. A coaxial pin 1015 (e.g., 50Ω) feeds the antenna. An RF array 1016 is on top of dielectric layer 1012 and ground plane 1011.

In operation, a feed wave is fed through coaxial pin 1015 and travels concentrically outward and interacts with the elements of RF array 1016.

The cylindrical feed in both the antennas of FIGS. 9B and 10 improves the service angle of the antenna. Instead of a service angle of plus or minus forty-five degrees azimuth (±45° Az) and plus or minus twenty-five degrees elevation (±25° El), In some embodiments, the antenna system has a service angle of seventy-five degrees (75°) from the bore sight in all directions. As with any beam forming antenna comprised of many individual radiators, the overall antenna gain is dependent on the gain of the constituent elements, which themselves are angle-dependent. When using common radiating elements, the overall antenna gain typically decreases as the beam is pointed further off bore sight. At 75 degrees off bore sight, significant gain degradation of about 6 dB is expected.

Embodiments of the antenna having a cylindrical feed solve one or more problems. These include dramatically simplifying the feed structure compared to antennas fed with a corporate divider network and therefore reducing total required antenna and antenna feed volume; decreasing sensitivity to manufacturing and control errors by maintaining high beam performance with coarser controls (extending all the way to simple binary control); giving a more advantageous side lobe pattern compared to rectilinear feeds because the cylindrically oriented feed waves result in spatially diverse side lobes in the far field; and allowing polarization to be dynamic, including allowing left-hand circular, right-hand circular, and linear polarizations, while not requiring a polarizer.

Array of Wave Scattering Elements

RF array 906 of FIG. 9B and RF array 1016 of FIG. 10 include a wave scattering subsystem that includes a group of patch antennas (e.g., scatterers) that act as radiators. This group of patch antennas comprises an array of scattering metamaterial elements.

In some embodiments, the cylindrical feed geometry of this antenna system allows the unit cells elements to be positioned at forty-five-degree (45°) angles to the vector of the wave in the wave feed. This position of the elements enables control of the polarization of the free space wave generated from or received by the elements. In some embodiments, the unit cells are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

Cell Placement

Figure 11:
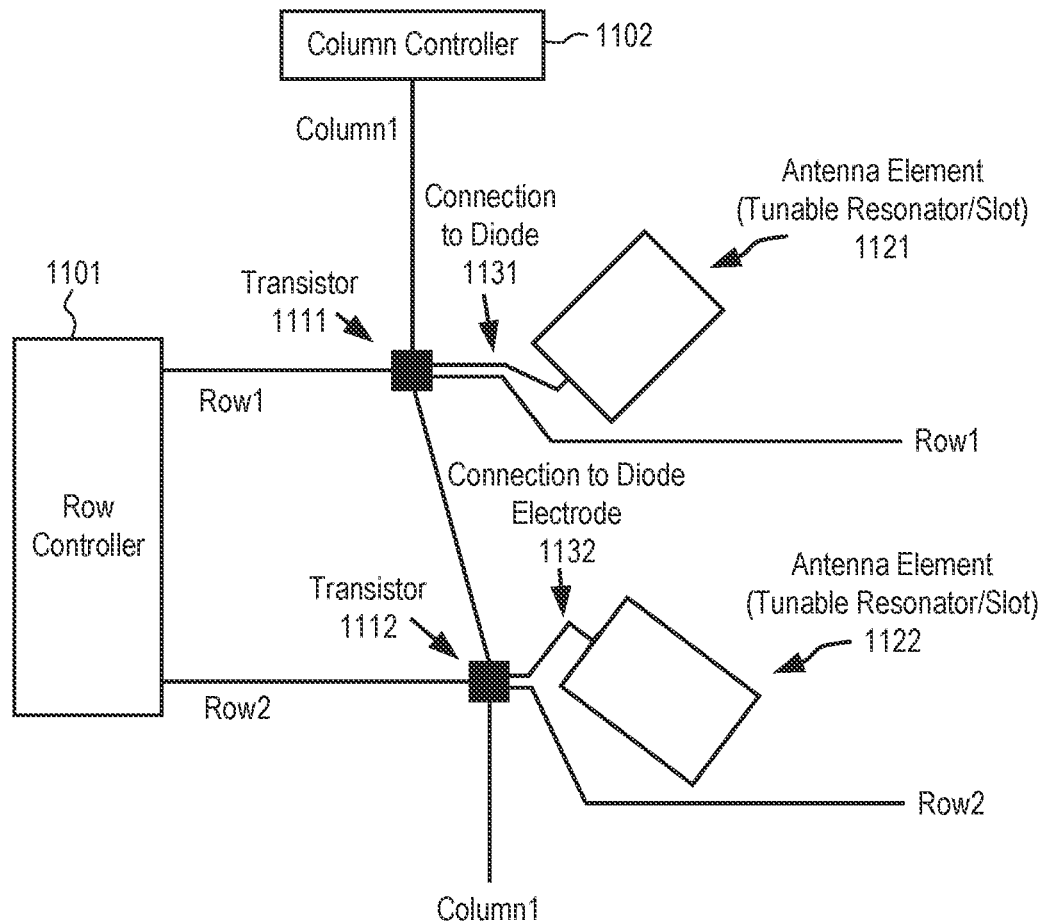
FIG. 11 illustrates one embodiment of the placement of matrix drive circuitry with respect to antenna elements.

In some embodiments, the antenna elements are placed on the cylindrical feed antenna aperture in a way that allows for a systematic matrix drive circuit. The placement of the cells includes placement of the transistors for the matrix drive. FIG. 11 illustrates one embodiment of the placement of matrix drive circuitry with respect to antenna elements. Referring to FIG. 11, row controller 1101 is coupled to transistors 1111 and 1112, via row select signals Row1 and Row2, respectively, and column controller 1102 is coupled to transistors 1111 and 1112 via column select signal Column1. Transistor 1111 is also coupled to antenna element 1121 via connection to diode 1131, while transistor 1112 is coupled to antenna element 1122 via connection to diode 1132.

In an initial approach to realize matrix drive circuitry on the cylindrical feed antenna with unit cells placed in a non-regular grid, two steps are performed. In the first step, the cells are placed on concentric rings and each of the cells is connected to a transistor that is placed beside the cell and acts as a switch to drive each cell separately. In the second step, the matrix drive circuitry is built in order to connect every transistor with a unique address as the matrix drive approach requires. Because the matrix drive circuit is built by row and column traces (similar to LCDs) but the cells are placed on rings, there is no systematic way to assign a unique address to each transistor. This mapping problem results in very complex circuitry to cover all the transistors and leads to a significant increase in the number of physical traces to accomplish the routing. Because of the high density of cells, those traces disturb the RF performance of the antenna due to coupling effect. Also, due to the complexity of traces and high packing density, the routing of the traces cannot be accomplished by commercially available layout tools.

In some embodiments, the matrix drive circuitry is pre-defined before the cells and transistors are placed. This ensures a minimum number of traces that are necessary to drive all the cells, each with a unique address. This strategy reduces the complexity of the drive circuitry and simplifies the routing, which subsequently improves the RF performance of the antenna.

More specifically, in one approach, in the first step, the cells are placed on a regular rectangular grid composed of rows and columns that describe the unique address of each cell. In the second step, the cells are grouped and transformed to concentric circles while maintaining their address and connection to the rows and columns as defined in the first step. A goal of this transformation is not only to put the cells on rings but also to keep the distance between cells and the distance between rings constant over the entire aperture. In order to accomplish this goal, there are several ways to group the cells.

Figure 12:
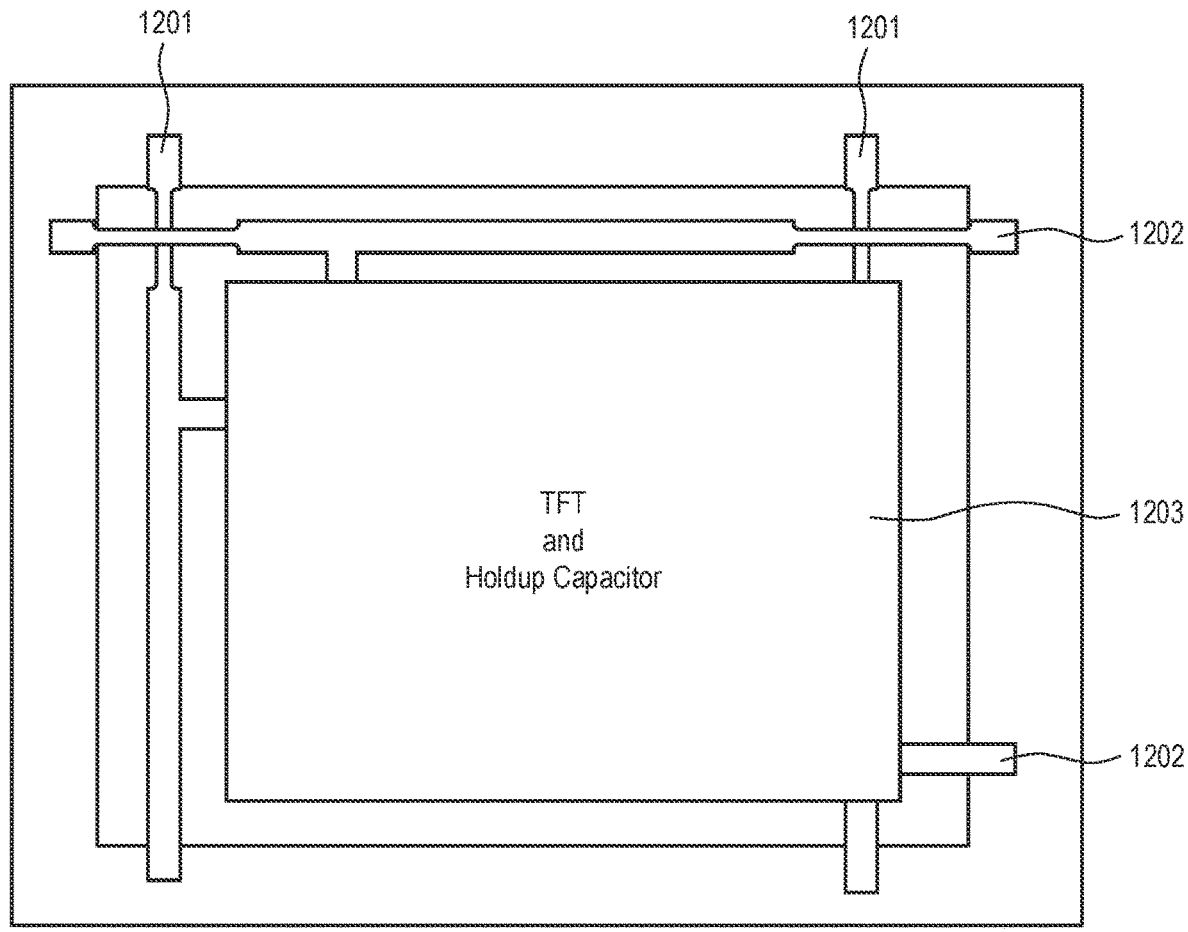
FIG. 12 illustrates one embodiment of a TFT package.

In some embodiments, a TFT package is used to enable placement and unique addressing in the matrix drive. FIG. 12 illustrates one embodiment of a TFT package. Referring to FIG. 12, a TFT and a hold capacitor 1203 is shown with input and output ports. There are two input ports connected to traces 1201 and two output ports connected to traces 1202 to connect the TFTs together using the rows and columns. In some embodiments, the row and column traces cross in 90° angles to reduce, and potentially minimize, the coupling between the row and column traces. In some embodiments, the row and column traces are on different layers.

An Example of a Full Duplex Communication System

Figure 13:
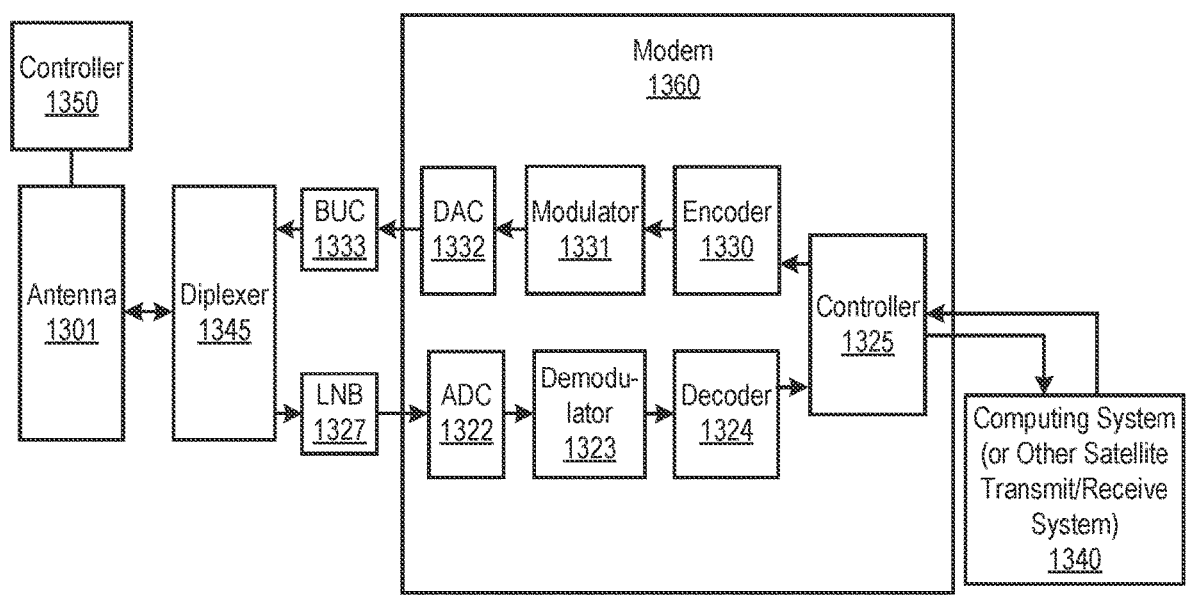
FIG. 13 is a block diagram of one embodiment of a communication system having simultaneous transmit and receive paths.

In another embodiment, the combined antenna apertures are used in a full duplex communication system. FIG. 13 is a block diagram of an embodiment of a communication system having simultaneous transmit and receive paths. While only one transmit path and one receive path are shown, the communication system may include more than one transmit path and/or more than one receive path.

Referring to FIG. 13, antenna 1301 includes two spatially interleaved antenna arrays operable independently to transmit and receive simultaneously at different frequencies as described above. In some embodiments, antenna 1301 is coupled to diplexer 1345. The coupling may be by one or more feeding networks. In some embodiments, in the case of a radial feed antenna, diplexer 1345 combines the two signals and the connection between antenna 1301 and diplexer 1345 is a single broad-band feeding network that can carry both frequencies.

Diplexer 1345 is coupled to a low noise block down converter (LNB) 1327, which performs a noise filtering function and a down conversion and amplification function in a manner well-known in the art. In some embodiments, LNB 1327 is in an out-door unit (ODU). In another embodiment, LNB 1327 is integrated into the antenna apparatus. LNB 1327 is coupled to a modem 1360, which is coupled to computing system 1340 (e.g., a computer system, modem, etc.).

Modem 1360 includes an analog-to-digital converter (ADC) 1322, which is coupled to LNB 1327, to convert the received signal output from diplexer 1345 into digital format. Once converted to digital format, the signal is demodulated by demodulator 1323 and decoded by decoder 1324 to obtain the encoded data on the received wave. The decoded data is then sent to controller 1325, which sends it to computing system 1340.

Modem 1360 also includes an encoder 1330 that encodes data to be transmitted from computing system 1340. The encoded data is modulated by modulator 1331 and then converted to analog by digital-to-analog converter (DAC) 1332. The analog signal is then filtered by a BUC (up-convert and high pass amplifier) 1333 and provided to one port of diplexer 1345. In some embodiments, BUC 1333 is in an out-door unit (ODU).

Diplexer 1345 operating in a manner well-known in the art provides the transmit signal to antenna 1301 for transmission.

Controller 1350 controls antenna 1301, including the two arrays of antenna elements on the single combined physical aperture.

The communication system would be modified to include the combiner/arbiter described above. In such a case, the combiner/arbiter after the modem but before the BUC and LNB.

Note that the full duplex communication system shown in FIG. 13 has a number of applications, including but not limited to, internet communication, vehicle communication (including software updating), etc.

With reference to FIGS. 1-13, it should be appreciated that other tunable capacitors, tunable capacitance dies, packaged dies, micro-electromechanical systems (MEMS) devices, or other tunable capacitance devices, could be placed into an aperture or elsewhere in variations on the embodiments described herein, for further embodiments. The techniques for mass transfer may be applicable to further embodiments, including placement of various dies, packaged dies or MEMS devices on various substrates for electronically scanned arrays and various further electrical, electronic and electromechanical devices.

There are a number of example embodiments described herein.

Example 1 is a calibration process for an antenna having radio-frequency (RF) radiating antenna elements, where the process comprises: determining resonance frequencies of RF radiating antenna elements in a group of RF radiating antenna elements; selecting voltages to apply to the RF radiating antenna elements to cause resonance frequencies to match between the RF radiating antenna elements in the group of RF radiating antenna elements when the voltages are applied; and storing, in memory of the antenna, voltage information indicative of the voltages for driving the RF radiating antenna elements in the group.

Example 2 is the process of example 1 that may optionally include that the voltages are part of resonance tuning curves.

Example 3 is the process of example 1 that may optionally include determining a tuning range for all elements of the group of RF radiating antenna elements; and determining voltage levels required by each RF radiating antenna element in the group of RF radiating antenna elements to reach predetermined resonance frequencies in the tuning range.

Example 4 is the process of example 3 that may optionally include that the resonance frequencies in the tuning range are ON, OFF, or grey-level resonance frequencies.

Example 5 is the process of example 1 that may optionally include accessing the memory to obtain the voltage information during operation of the antenna; and using the voltage information to produce voltages for the RF radiating antenna elements to generate one or more beams with the antenna.

Example 6 is the process of example 1 that may optionally include that the RF radiating antenna elements are varactor-based antenna elements.

Example 7 is the process of example 1 that may optionally include that the RF radiating antenna elements are liquid-crystal (LC)-based antenna elements.

Example 8 is the process of example 1 that may optionally include that the RF radiating antenna elements are Micro-Electro-Mechanical Systems (MEMs)-based antenna elements.

Example 9 is a process for calibrating an antenna, where the process comprises: performing resonance frequency matching of groups of the radio-frequency (RF) radiating antenna elements in the antenna to align resonance frequency of the RF radiating antenna elements in the groups of RF radiating antenna elements when voltages are applied to the RF radiating antenna elements by evaluating an aggregate resonance responses of the groups of RF radiating antenna elements; and determining resonance frequency to use with the antenna elements of the antenna.

Example 10 is the process of example 9 that may optionally include that determining resonance frequency comprises adjusting voltage applied to the RF radiating antenna elements to cause the resonance frequencies of RF antenna elements in the groups of RF antenna elements to match each other.

Example 11 is the process of example 9 that may optionally include that determining resonance frequency comprises determining resonance frequency tuning curves to use with the antenna elements of the antenna Example 12 is the process of example 9 that may optionally include that evaluating the aggregate resonance responses of the groups of antenna elements includes adjusting resonance frequency curves of the antenna elements based on the aggregate resonance responses.

Example 13 is the process of example 9 that may optionally include that evaluating the aggregate responses of the groups of antenna elements is performed by measuring the quality (Q) factor of the antenna.

Example 14 is the process of example 9 that may optionally include determining a tuning range for all elements of the groups of RF radiating antenna elements; and determining voltage levels required by each RF radiating antenna element in the groups of RF radiating antenna elements to reach predetermined resonance frequencies in the tuning range Example 15 is the process of example 9 that may optionally include determining ON and OFF resonance frequencies for each group of the RF radiating antenna elements after performing frequency matching; determining a new tuning range as a difference between the ON and OFF frequencies that represents an overlapping frequency range where the frequency ranges between the ON and OFF resonance frequencies of all the groups of RF radiating antenna elements overlaps; dividing the new tuning range into a predetermined number of points; determining one or more voltages to apply to each group of RF antenna elements to obtain a frequency associated with each of the points of the new tuning range; selecting one voltage per group thereof for each point; and storing the one voltage per group for each point.

Example 16 is the process of example 14 that may optionally include that selecting one voltage per group for each point is based on the Q factor.

Example 17 is the process of example 9 that may optionally include that the group of RF antenna elements comprises a segment of RF antenna elements.

Example 18 is the process of example 9 that may optionally include that the RF radiating antenna elements are varactor-based antenna elements.

Example 19 is the process of example 9 that may optionally include that the RF radiating antenna elements are liquid-crystal (LC)-based antenna elements.

Example 20 is the process of example 9 that may optionally include that the RF radiating antenna elements are Micro-Electro-Mechanical Systems (MEMs)-based antenna elements.

Example 21 is an antenna comprising: RF radiating antenna elements; a memory to store voltage information indicative of the voltages for driving the RF radiating antenna elements; an antenna control unit coupled to the RF radiating antenna elements and the memory and operable to: access the memory, using an indication of a frequency at which the antenna is to operate, to obtain the voltage information for each of the RF radiating antenna elements, and drive the antenna elements with voltage associated with the voltage information, wherein the voltage information is created using the method of claim 1.

Example 22 is a process comprising: measuring the quality (Q) factor of an aggregate response of antenna elements of an antenna aperture; and adjusting resonance frequency curves of the antenna elements to improve the Q factor.

All of the methods and tasks described herein may be performed and fully automated by a computer system. The computer system may, in some cases, include multiple distinct computers or computing devices (e.g., physical servers, workstations, storage arrays, cloud computing resources, etc.) that communicate and interoperate over a network to perform the described functions. Each such computing device typically includes a processor (or multiple processors) that executes program instructions or modules stored in a memory or other non-transitory computer-readable storage medium or device (e.g., solid state storage devices, disk drives, etc.). The various functions disclosed herein may be embodied in such program instructions, or may be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid-state memory chips or magnetic disks, into a different state. In some embodiments, the computer system may be a cloud-based computing system whose processing resources are shared by multiple distinct business entities or other users.

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware (e.g., ASICs or FPGA devices), computer software that runs on computer hardware, or combinations of both. Moreover, the various illustrative logical blocks and modules described in connection with the embodiments disclosed herein can be implemented or performed by a machine, such as a processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the rendering techniques described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements or steps. Thus, such conditional language is not generally intended to imply that features, elements or steps are in any way required for one or more embodiments or that one or more embodiments necessarily include logic for deciding, with or without other input or prompting, whether these features, elements or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, or Z). Thus, such disjunctive language is not generally intended to, and should not, imply that certain embodiments require at least one of X, at least one of Y, and at least one of Z to each be present.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

We claim:

1. A calibration process for an antenna having radio-frequency (RF) radiating antenna elements, the process comprising:
   determining resonance frequencies of RF radiating antenna elements in a group of RF radiating antenna elements;
   selecting voltages to apply to the RF radiating antenna elements to cause resonance frequencies to match between the RF radiating antenna elements in the group of RF radiating antenna elements when the voltages are applied, wherein selecting voltages includes selecting different voltages for two or more of the RF radiating antenna elements to compensate for resonance frequency differences due to manufacturing variations between the two or more RF radiating antenna elements and/or driving circuits for the two or more RF radiating antenna elements; and
   storing, in memory of the antenna, voltage information indicative of the voltages for driving the RF radiating antenna elements in the group.

2. The process of claim 1 wherein the voltages are part of resonance tuning curves.

3. The process of claim 1 further comprising:
   determining a tuning range for all elements of the group of RF radiating antenna elements; and
   determining voltage levels required by each RF radiating antenna element in the group of RF radiating antenna elements to reach predetermined resonance frequencies in the tuning range.

4. The process of claim 3 wherein the resonance frequencies in the tuning range are ON, OFF, or grey-level resonance frequencies.

5. The process of claim 1 further comprising:
   accessing the memory to obtain the voltage information during operation of the antenna; and
   using the voltage information to produce voltages for the RF radiating antenna elements to generate one or more beams with the antenna.

6. The process of claim 1 wherein the RF radiating antenna elements are varactor-based antenna elements.

7. The process of claim 1 wherein the RF radiating antenna elements are liquid-crystal (LC)-based antenna elements.

8. The process of claim 1 wherein the RF radiating antenna elements are Micro-Electro-Mechanical Systems % MEMs)-based antenna elements.

9. An antenna comprising:
   RF radiating antenna elements;
   a memory to store voltage information indicative of the voltages for driving the RF radiating antenna elements;
   an antenna control unit coupled to the RF radiating antenna elements and the memory and operable to:
      access the memory, using an indication of a frequency at which the antenna is to operate, to obtain the voltage information for each of the RF radiating antenna elements, and
      drive the antenna elements with voltage associated with the voltage information, wherein the voltage information is created using the method of claim 1.

10. A process for calibrating an antenna, the process comprising:
    performing resonance frequency matching of groups of the radio-frequency (RF) radiating antenna elements in the antenna to align resonance frequency of the RF radiating antenna elements in the groups of RF radiating antenna elements when voltages are applied to the RF radiating antenna elements by
       evaluating an aggregate resonance responses of the groups of RF radiating antenna elements; and
       determining resonance frequency to use with the antenna elements of the antenna.

11. The process of claim 10 wherein determining resonance frequency comprises adjusting voltage applied to the RF radiating antenna elements to cause the resonance frequencies of RF antenna elements in the groups of RF antenna elements to match each other.

12. The process of claim 10 wherein determining resonance frequency comprises determining resonance frequency tuning curves to use with the antenna elements of the antenna.

13. The process of claim 10 wherein evaluating the aggregate resonance responses of the groups of antenna elements includes adjusting resonance frequency curves of the antenna elements based on the aggregate resonance responses.

14. The process of claim 10 wherein evaluating the aggregate responses of the groups of antenna elements is performed by measuring the quality (Q) factor of the antenna.

15. The process of claim 10 further comprising:
    determining a tuning range for all elements of the groups of RF radiating antenna elements; and
    determining voltage levels required by each RF radiating antenna element in the groups of RF radiating antenna elements to reach predetermined resonance frequencies in the tuning range.

16. The process of claim 15 wherein selecting one voltage per group for each point is based on the Q factor.

17. The process of claim 10 further comprising:
    determining ON and OFF resonance frequencies for each group of the RF radiating antenna elements after performing frequency matching;
    determining a new tuning range as a difference between the ON and OFF frequencies that represents an overlapping frequency range where the frequency ranges between the ON and OFF resonance frequencies of all the groups of RF radiating antenna elements overlaps;
    dividing the new tuning range into a predetermined number of points;

determining one or more voltages to apply to each group of RF antenna elements to obtain a frequency associated with each of the points of the new tuning range;
selecting one voltage per group thereof for each point; and storing the one voltage per group for each point.

18. The process of claim 10 wherein the group of RF antenna elements comprises a segment of RF antenna elements.

19. The process of claim 10 wherein the RF radiating antenna elements are varactor-based antenna elements.

20. The process of claim 10 wherein the RF radiating antenna elements are liquid-crystal (LC)-based antenna elements.

21. The process of claim 10 wherein the RF radiating antenna elements are Micro-Electro-Mechanical Systems % MEMs)-based antenna elements.

22. A process comprising:
measuring the quality (Q) factor of an aggregate response of antenna elements of an antenna aperture; and
adjusting resonance frequency curves of the antenna elements to improve the Q factor.

* * * * *